(12) United States Patent
Chan et al.

(10) Patent No.: US 11,621,680 B2
(45) Date of Patent: Apr. 4, 2023

(54) POWER AMPLIFIER

(71) Applicant: City University of Hong Kong, Kowloon (HK)

(72) Inventors: Wingshing Chan, Kowloon (HK); Liheng Zhou, Kowloon (HK); Xinyu Zhou, Kowloon (HK); Derek Ho, Kowloon (HK)

(73) Assignee: City University of Hong Kong, Kowloon (HK)

( * ) Notice: Subject to any disclaimer, the term of this patent is extended or adjusted under 35 U.S.C. 154(b) by 236 days.

(21) Appl. No.: 17/092,689

(22) Filed: Nov. 9, 2020

(65) Prior Publication Data
US 2022/0149794 A1    May 12, 2022

(51) Int. Cl.
| | | |
|---|---|---|
| *H03F 3/24* | (2006.01) | |
| *H03F 3/19* | (2006.01) | |
| *H03F 1/56* | (2006.01) | |
| *H03F 3/195* | (2006.01) | |

(52) U.S. Cl.
CPC ............... *H03F 3/195* (2013.01); *H03F 1/56* (2013.01); *H03F 3/245* (2013.01); *H03F 2200/318* (2013.01); *H03F 2200/451* (2013.01); *H03F 2200/541* (2013.01)

(58) Field of Classification Search
CPC .................................. H03F 3/195; H03F 1/56
See application file for complete search history.

(56) References Cited

U.S. PATENT DOCUMENTS

| | | | |
|---|---|---|---|
| 4,323,736 A * | 4/1982 | Strickland .............. | H04R 19/02 381/116 |
| 7,245,186 B2 | 7/2007 | Chang et al. | |
| 8,076,975 B1 * | 12/2011 | Lender, Jr. ............. | H03F 3/607 330/54 |
| 8,324,973 B2 * | 12/2012 | Paul ........................ | H03F 1/565 330/253 |
| 9,882,543 B2 | 1/2018 | Mohammadpour et al. | |
| 9,991,857 B2 | 6/2018 | Lizarraga | |
| 10,084,411 B2 | 9/2018 | Lehtola | |
| 10,122,334 B2 | 11/2018 | Akbarpour et al. | |
| 10,320,339 B2 | 6/2019 | Leipold et al. | |
| 10,348,260 B2 | 6/2019 | Oishi et al. | |
| 10,355,722 B2 | 7/2019 | Desclos et al. | |
| 10,411,659 B2 | 9/2019 | Jang et al. | |
| 10,447,214 B2 | 10/2019 | Andrei et al. | |
| 10,453,810 B2 | 10/2019 | DeBoet et al. | |
| 2005/0083117 A1 * | 4/2005 | Kim ........................ | H03F 1/32 330/51 |
| 2009/0309659 A1 * | 12/2009 | Lender, Jr. ................ | H03F 1/42 330/277 |
| 2014/0085002 A1 * | 3/2014 | Anderson ........... | H01F 27/2804 336/200 |
| 2020/0321918 A1 * | 10/2020 | Grebennikov ........ | H03F 1/0288 |

* cited by examiner

*Primary Examiner* — Patricia T Nguyen
(74) *Attorney, Agent, or Firm* — Renner Kenner Greive Bobak Taylor Weber

(57) ABSTRACT

A power amplifier includes an active device and an output matching circuit operably connected with the active device. The output matching circuit includes a bandpass impedance transformer, in particular, a multimode bandpass impedance transformer. The multimode bandpass impedance transformer may include a multimode resonator and coupling feed lines.

22 Claims, 25 Drawing Sheets

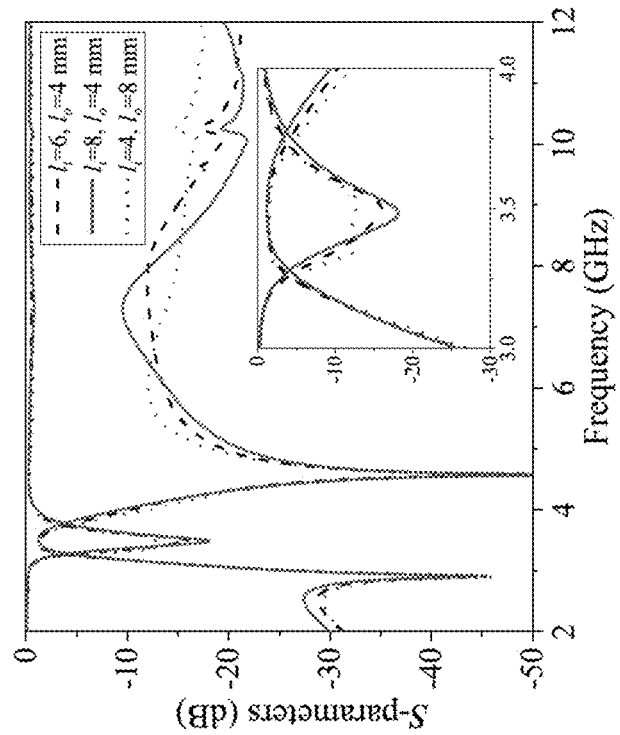
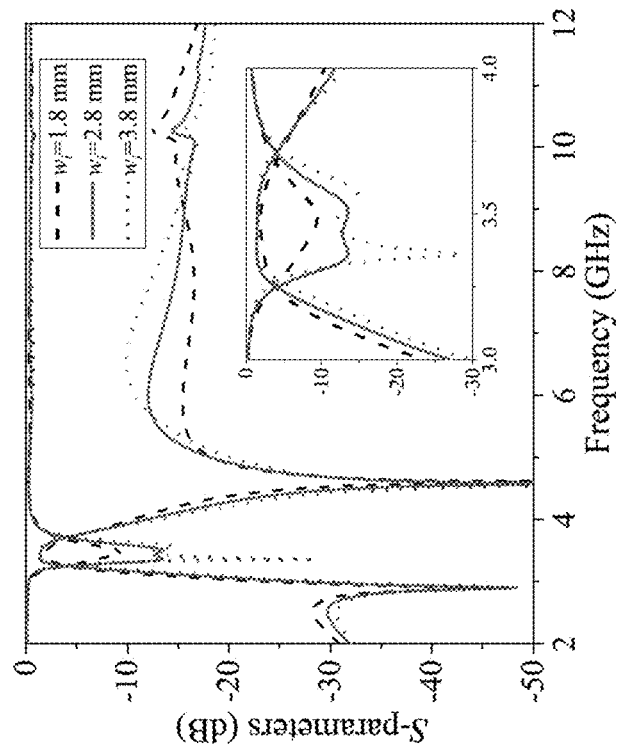
Figure 11A
Figure 11B

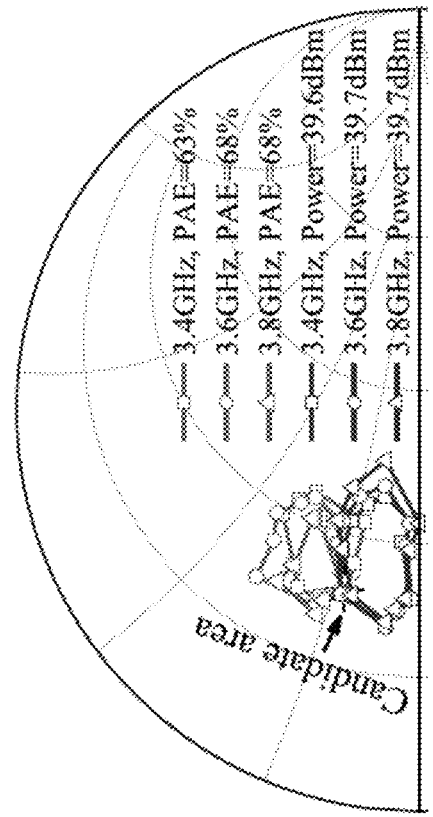
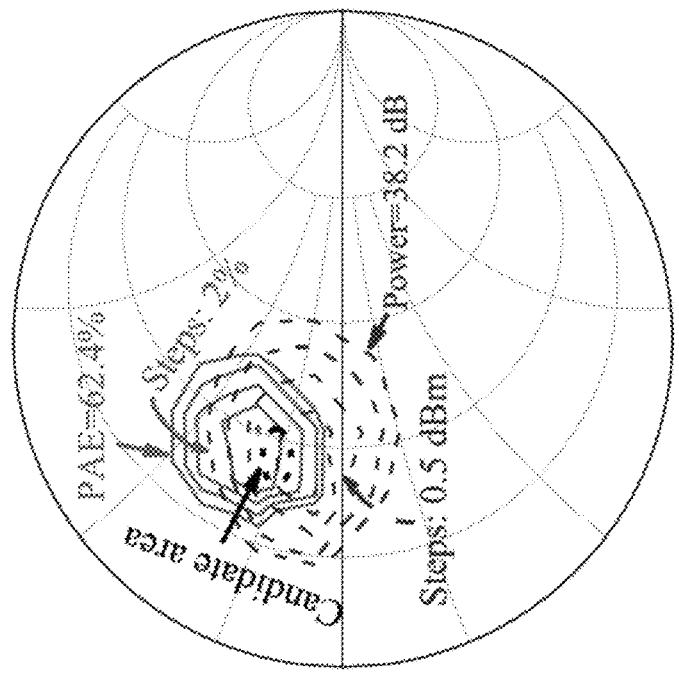
Figure 13A
Figure 13B

POWER AMPLIFIER

TECHNICAL FIELD

The invention relates to a power amplifier and a related communication device.

BACKGROUND

Power amplifiers are one of the most power-hungry components in communication devices and systems, and the efficiency of power amplifiers is a key performance metric. Currently, switch-mode architectures, such as Class D amplifiers and Class E amplifiers are good candidates for high-efficiency power amplifiers. However, these types of power amplifiers may suffer from strong nonlinearity and may be limited to well below their maximum operating frequency. On the other hand, harmonic-control power amplifiers such as Class-F amplifiers, inverse Class-F (Class-F$^{-1}$) amplifiers, Class-J amplifiers, and continuous mode architectures exploit harmonic terminations at the second harmonic and the third harmonic to minimize overlap between drain voltage and current waveforms to increase efficiency.

Existing bandpass power amplifiers, in particular bandpass harmonic-control power amplifiers, are typically implemented by a cascade of second-order topologies. To achieve a relatively wide and flat passband response, the second-order topologies, involving multiple blocks, are cascaded. This may lead to undesirable complexity, large size or footprint, high loss, and low efficiency, especially at high frequencies or for wide bandwidths operations, which are not satisfactory in some applications.

SUMMARY OF THE INVENTION

In a first aspect of the invention, there is provided a power amplifier including an active device and an output matching circuit operably connected with the active device. The output matching circuit includes a bandpass impedance transformer.

In one embodiment of the first aspect, the bandpass impedance transformer is a multimode bandpass impedance transformer. For example, the multimode bandpass impedance transformer may be a dual-mode bandpass impedance transformer or a quad-mode bandpass impedance transformer.

In one embodiment of the first aspect, the multimode bandpass impedance transformer includes a multimode resonator and coupling feed lines operably connected with the multimode resonator. The coupling feed lines may be operably connected with the multimode resonator in a non-contact manner. The coupling feed lines may be microstrip lines. The coupling feed lines may include separate (e.g., spaced apart) first and second coupling feed lines that are operably coupled. The coupling feed lines may include further coupling feed lines. The multimode resonator may provide multiple transmission poles that give the power amplifier a flat and wide bandwidth/response.

In one embodiment of the first aspect, the multimode bandpass impedance transformer further includes a tapped line connected, directly or indirectly, between the active device and the first coupling feed line, and the second coupling feed line is connected to an output.

In one embodiment of the first aspect, the multimode resonator may be a microstrip resonator, e.g., of a continuous microstrip line or a single continuous microstrip with or without branches.

In one embodiment of the first aspect, the microstrip resonator has an axis of symmetry. The multimode bandpass impedance transformer may be asymmetric relative to the axis of symmetry.

In one embodiment of the first aspect, the microstrip resonator includes an $\lambda_g/2$ open-ended resonator loaded by short-circuit stub. With this arrangement, a dual-mode resonator and hence a dual-mode bandpass impedance transformer may be provided. The short circuit stub may be connected to a central part of the $\lambda_g/2$ open-ended resonator.

In one embodiment of the first aspect, the microstrip resonator includes an $\lambda_g/2$ open-ended resonator loaded by short-circuit stub as well as two L-shaped stubs connected with the $\lambda_g/2$ open-ended resonator. With this arrangement, a quad-mode resonator and hence a quad-mode bandpass impedance transformer may be provided. The short-circuit stub may be spatially arranged between the two L-shaped stubs. The two L-shaped stubs may be symmetrically arranged, i.e., about an axis of reflection. The two L-shaped stubs may be of the same form and size.

In one embodiment of the first aspect, the $\lambda_g/2$ open-ended resonator defines a $\lambda_g/4$ resonator, and the tapped line is aligned with a voltage null point of the $\lambda_g/4$ resonator for spurious response, e.g., $3^{rd}$ order spurious frequency response, suppression. The first coupling feed line may define a $\lambda_g/2$ open-ended resonator.

In one embodiment of the first aspect, the active device includes a transistor. In one example, the transistor is a GaN transistor. The transistor may include a field effect transistor. In one example, the transistor is a high-electron-mobility transistor (HEMT). The transistor includes, at least, a gate terminal, a drain terminal, and a source terminal. The power amplifier may further include a gate bias stub, optionally connected with bypass capacitors, for the gate terminal. The power amplifier may further include a drain bias stub, optionally connected with bypass capacitors, for the drain terminal. A tuning line may be connected between the drain terminal and bandpass impedance transformer.

In one embodiment of the first aspect, the power amplifier is an inverse Class-F power amplifier, which is arranged to provide open circuit at $2^{nd}$ harmonics frequencies and short circuit at $3^{rd}$ harmonic frequencies. The power amplifier may alternatively be a high efficiency power amplifier of different Classes.

In one embodiment of the first aspect, the power amplifier further includes an input matching circuit. The input matching circuit may include microstrip lines. The input matching circuit may be a stepped-impedance input matching circuit. The input matching circuit may include first and second microstrip lines and an RC stabilization circuit (e.g., with parallel resistor and capacitor) arranged between the first and second microstrip lines. The first microstrip line may be generally T-shaped. The second microstrip line may be generally straight. The input matching circuit may include a DC blocking capacitor. The first microstrip line may have an input side and an output side. The input side may be connected with the DC blocking capacitor and the output side may be connected with the RC stabilization circuit.

In a second aspect of the invention, there is provided a communication device includes the power amplifier of the first aspect. The communication device may be a communication device adapted for $_5$G wireless operations. The communication device may also be used for other wireless/cellular communication protocols. The communication device may be a wireless communication device. The communication device may be a mobile phone, a wearable device, an IoT device, a computer, a tablet, a smart watch, a satellite communication system, a base station, etc.

Expressions such that "generally", "about", "substantially", or the like, depending on context, are used to take into account manufacture tolerance, assembly tolerance, degradation, trend, tendency, errors, or the like, which may be plus or minus 10%, plus or minus 5%, plus or minus 2%, plus or minus 1%, etc., of the indicated value.

Other features and aspects of the invention will become apparent by consideration of the detailed description and accompanying drawings. Any feature(s) described herein in relation to one aspect or embodiment may be combined with any other feature(s) described herein in relation to any other aspect or embodiment as appropriate and applicable.

BRIEF DESCRIPTION OF THE DRAWINGS

Embodiments of the invention will now be described, by way of example, with reference to the accompanying drawings in which:

FIG. 11A is a graph showing a simulated dual-mode response (S-parameters) of the bandpass impedance transformer constructed based on the bandpass impedance transformer in FIG. 4;

FIG. 11B is a graph showing a simulated dual-mode response (S-parameters) of the bandpass impedance transformer constructed based on the bandpass impedance transformer in FIG. 4;

FIG. 13A is a plot showing the power contour and power added efficiency contour of the bandpass impedance transformer obtained by using load-pull simulation at 3.5 GHz;

FIG. 13B is a plot showing the power contour and power added efficiency contour of the bandpass impedance transformer obtained by using load-pull simulation at different frequencies;

DETAILED DESCRIPTION

Figure 1:
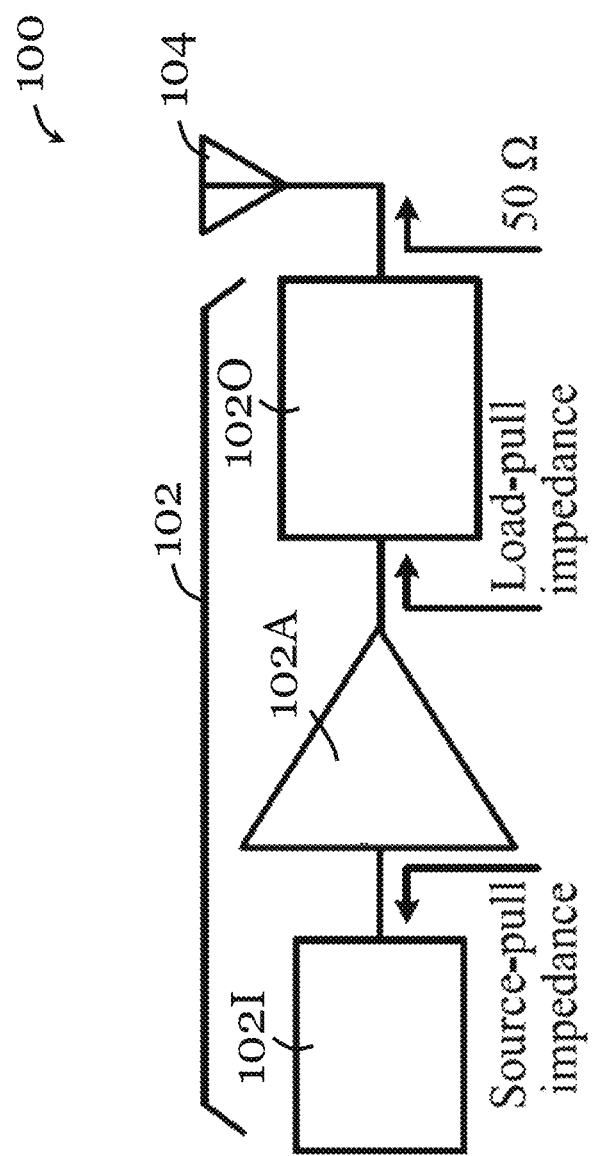
FIG. 1 is a schematic diagram of a communication assembly with a power amplifier in one embodiment of the invention.

FIG. 1 shows a communication assembly 100 in one embodiment of the invention. The communication assembly 100 may be arranged to transmit and/or receive radio frequencies signals. The communication assembly 100 includes a power amplifier 102 and an antenna element 104 connected with the power amplifier 102. The power amplifier 102 is a bandpass power amplifier, which enables the desired frequency band be targeted more accurately. The power amplifier 102 includes an active device 102A, an input matching circuit 102I connected with the input of the active device 102A, and an output matching circuit 102O connected with the output of the active device 102A. The active device 102A may be a transistor such as a field effect transistor (e.g., high-electron-mobility transistor). The input matching circuit 102I may see a source-pull impedance; the output matching circuit 102O may see a load-pull impedance; the antenna element 104 may see a 50Ω characteristic impedance.

In some embodiments, the power amplifier may be a Class-F amplifier, which provides a short circuit at $2^{nd}$ harmonics frequencies and an open circuit at $3^{rd}$ harmonic frequencies. In some other embodiments, the power amplifier may be an inverse Class-F (Class-$F^{-1}$) amplifier, which provides an open circuit at $2^{nd}$ harmonics frequencies and short circuit at $3^{rd}$ harmonic frequencies, and which may give square-wave current and half-sinusoidal voltage signals. The drain efficiency η of Class-F/$F^{-1}$ power amplifier can be calculated by $\eta=1-V_{th}/V_{dc}$, where $V_{th}$ and $V_{dc}$ are the threshold and DC supply voltage, respectively. The efficiencies are differentiated from each other by the different $V_{th}$ under constant $V_{dc}$. In one example, the transistor may be a high electron mobility transistor, and its drain-to-source current can be expressed as $$I_d=(a/b)\mu_n C_{OX}[V_{ds}(V_{gs}-V_{th})-0.5V_{ds}^2] \quad (1)$$

where a and b are the width and length of channel, $\mu_n$ is carrier mobility, $C_{ox}$ is the gate capacitance per unit area. These parameters are fixed and their values depend on the processing technology. $I_d$ is inversely proportional to $V_{th}$. The greater the $I_d$, the larger the η. The time-domain current of the Class-F/$F^{-1}$ power amplifier, using Fourier-series analysis, are $I_{DF}$ and $I_{DIF}$ respectively, which can be expressed as $$I_{DF} = I_{PF}\left(\frac{1}{\pi} + \frac{1}{2}\sin \omega_0 t - \frac{2}{\pi}\sum_{x=2,4,6...}\frac{1}{x^2-1}\cos x\omega_0 t\right) \quad (2)$$

$$I_{DIF} = \frac{I_{PIF}}{2}\left(1 + \frac{4}{\pi}\sum_{x=1,3,5...}\frac{1}{x}\sin x\omega_0 t\right) \quad (3)$$

The radiofrequency (RF) fundamental components of Equations (2) and (3) can be extracted to be $I_{df}=I_{PF}\cdot\sin(\omega_0 t/2)$ and $I_{dif}=2I_{PF}\cdot\sin(\omega_0 t/\pi)$. From this, it can be seen that $I_{dif}>I_{df}$. Thus, in some applications, the efficiency of Class-$F^{-1}$ power amplifiers is qualitatively better than that of Class F power amplifiers.

Figure 2:
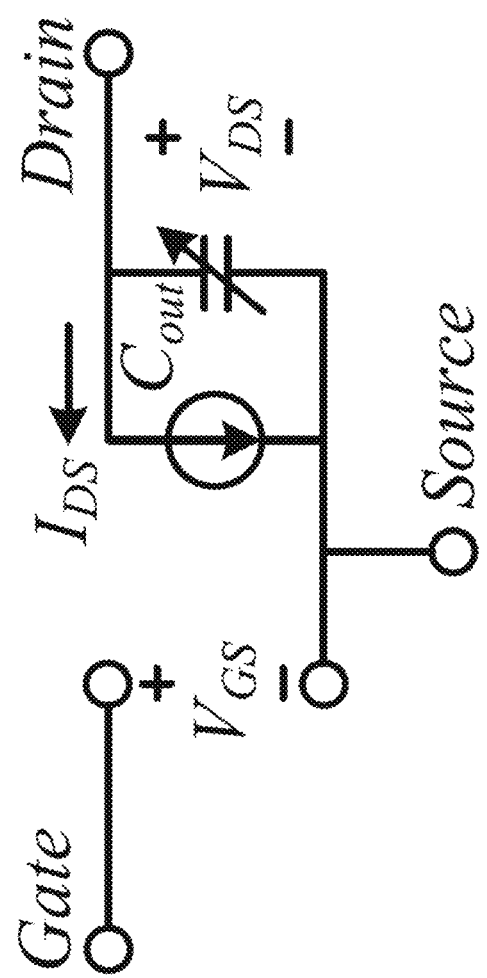
FIG. 2 is a schematic diagram of a circuit model for a transistor.

FIG. 2 shows a simplified equivalent circuit model of a transistor, such as one that can be used in the assembly 100 of FIG. 1, with the drain, source, and gate terminals respectively. An output capacitance $c_{out}$ and a voltage-control current source are connected in parallel and between the drain and source terminals. $C_{out}$ is determined by $V_{DS}$ and it includes the drain-source capacitance $C_{DS}$ and gate-drain capacitance $C_{GD}$. $C_{out}$ has a strong non-linearity and the value increases if a low $V_{DS}$ or high input power is presented. In Class-F operation, the drain terminal requires infinite impedance at $3^{rd}$ harmonic frequency, but the m large $C_{out}$ at a high frequency range presents a quasi-short circuit condition. Therefore, compared with Class-F operation, Class-$F^{-1}$ operation is more suited for high-frequency applications in some cases.

Figure 3:
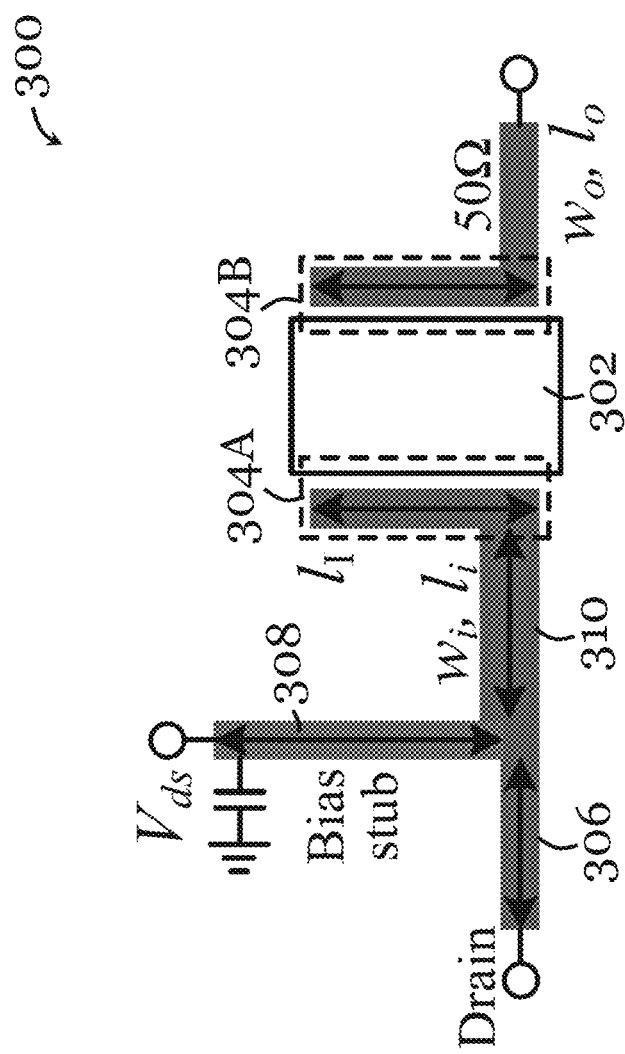
FIG. 3 is a schematic diagram of an output matching circuit including a bandpass impedance transformer for a power amplifier in one embodiment of the invention.

FIG. 3 shows an output matching circuit 300 for a power amplifier in one embodiment of the invention. The output matching circuit 300 may be used as the output matching circuit 102O in the power amplifier 102 of the communication assembly 100 in FIG. 1. The output matching circuit 300 (and different parts of it) may be constructed partly or entirely using microstrip lines. In this embodiment the output matching circuit 300 includes a tuning line 306 connected to the drain terminal of the transistor (not shown) to compensate for its imaginary part, a drain bias stub 308 connected at its end with a DC voltage supply $V_{DC}$ and to the RF ground via a bypass capacitor, and a bandpass impedance transformer. The bandpass impedance transformer includes a tapped line 310 connected with the tuning line 306 and the drain bias stub 308. The bandpass impedance transformer also includes a multimode resonator 302 and first and second coupling feed lines 304A, 304B operably connected with each other. In this embodiment the bandpass impedance transformer includes only one single multimode resonator. The first and second coupling feed lines 304A, 304B are separated, spaced apart from each other and from the multimode resonator 302. The tapped line 310, with width co, and length I is arranged to provide proper coupling strength for coupling with the multimode resonator 302. The drain bias stub 308 with length $l_{bs}$ may acts as λ/4 transformer and presents a high-impedance state to the bandpass impedance transformer. The coupling structure, i.e., the coupling feed lines 304A, 304B and the multimode resonator 302, may be routed in such a way to occupy a small footprint. The coupling feed lines 304A, 304B define a coupling length $l_I$ that can be used for spurious suppression, as explained in greater detail below.

Figure 4:
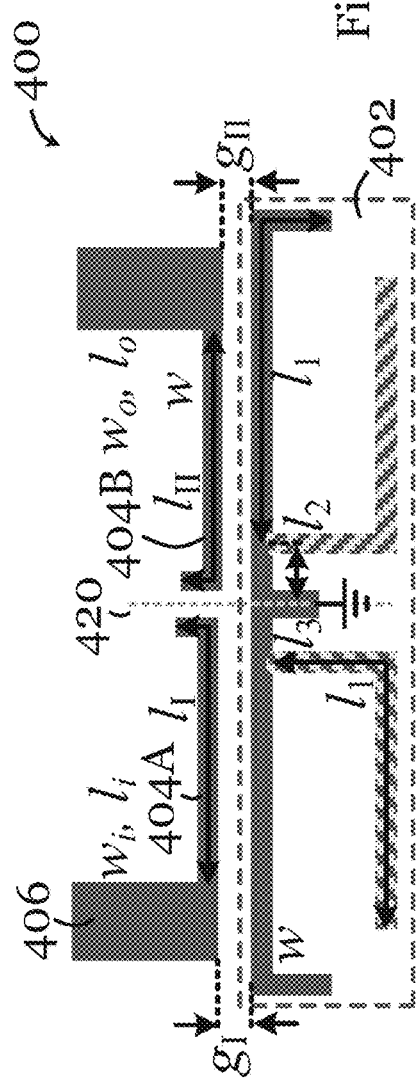
FIG. 4 is a schematic diagram of a bandpass impedance transformer in one embodiment of the invention.
Figure 5:
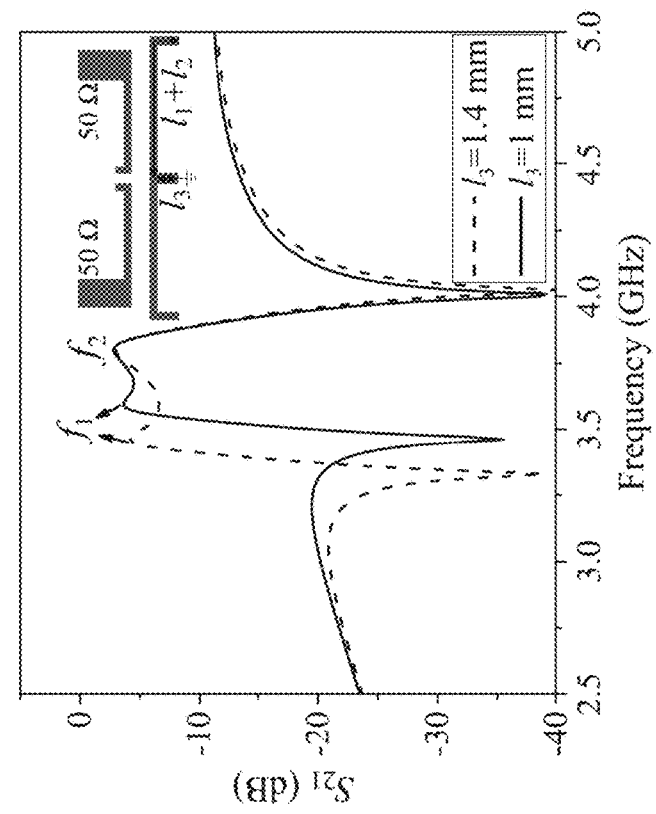
FIG. 5 is a graph showing S21 parameter of a dual-mode impedance transformer constructed based on the bandpass impedance transformer in FIG. 4.

FIG. 4 shows a multimode bandpass impedance transformer 400 in one embodiment of the invention, while FIG. 5 shows the S21 parameter of a dual-mode impedance transformer constructed based on the bandpass impedance transformer 400 in FIG. 4. The multimode bandpass impedance transformer 400 may be the bandpass impedance transformer in the output matching circuit 300 of FIG. 3. The dual-mode bandpass impedance transformer (a bandpass filter) in FIG. 5 has these parameters: $\omega=0.4$, $\omega_i=\omega=1.8$, $l_1+l_2=12.2$, $l_3=1$ (all in mm).

Referring to FIG. 4, the multimode bandpass impedance transformer 400 includes a tapped line 406, a first coupling feed line 404A, a second coupling feed line 404B, and a multimode resonator 402 (shown in the dashed rectangle). The tapped line 406 is generally straight. The first coupling feed line 404A includes an elongated main portion, generally perpendicular to the tapped line 406, and a short end hook portion, generally parallel to the tapped line 406. The second coupling feed line 404B is constructed similarly, with an elongated main portion, generally parallel with the elongated main portion of the first coupling feed line 404A, and a short end hook portion. The end hook portions of the first and second coupling feed lines 404A, 404B are in facing relation to each other. In this example, the first and second coupling feed lines 404A, 404B are offset such that their axes of extensions are parallel not collinear.

The multimode resonator 402 may be a microstrip resonator (formed by microstrip lines). In this example, the microstrip resonator includes an elongated portion and two end portions generally perpendicular to the elongated portion, as well as a central short sub portion connected to a center part of the elongated portion. These portions (assume without the L-shaped stubs discussed below) alone define a $\lambda_g/2$ open-ended resonator loaded by a central short-circuit stub (grounded), which can be bisected into two $\lambda/4$ resonators. The microstrip resonator may have an axis of symmetry 420 parallel to its short axis or central line. In some implementations, the multimode resonator 402 additionally includes two L-shaped stubs of similar or the same size and form, disposed symmetrically about an axis of reflection, which, in this example, coincides with the axis of symmetry 420.

In the embodiment that the multimode resonator 402 does not have the L-shaped stubs, the multimode resonator 402 is a dual-mode resonator. In the embodiment that the multimode resonator 402 has the L-shaped stubs, the multimode resonator 402 is a quad-mode resonator.

In the dual-mode embodiment of the resonator 402, the dual-mode resonant frequencies can be expressed as $$f_1=c/[4(l_1+l_2+l_3)\sqrt{\varepsilon_{ef}}] \quad (4)$$

$$f_2=c/[4(l_1+l_2)\sqrt{\varepsilon_{ef}}] \quad (5)$$

where c is the speed of light in free space, and $\varepsilon_{ef}$ denotes the effective dielectric constant of the substrate. It can be seen that both $f_1$ and $f_2$ are determined by $(l_1+l_2)$, while only $f_1$ is related to $l_3$, as shown in the graph in FIG. 5.

Figure 6B:
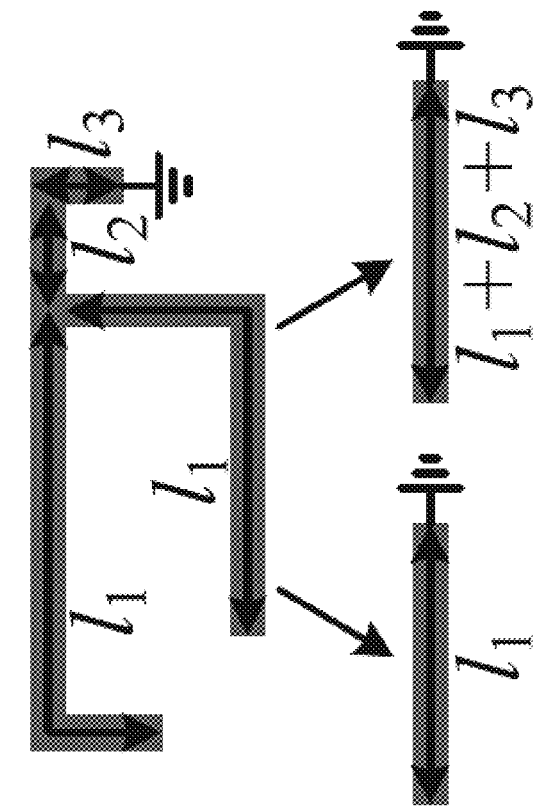
FIG. 6B is a schematic diagram of an even-mode equivalent circuit of the bandpass impedance transformer in FIG. 4 in which the even-mode equivalent circuit can be divided into an odd-even mode sub-circuit and an even-even mode sub-circuit.
Figure 6A:
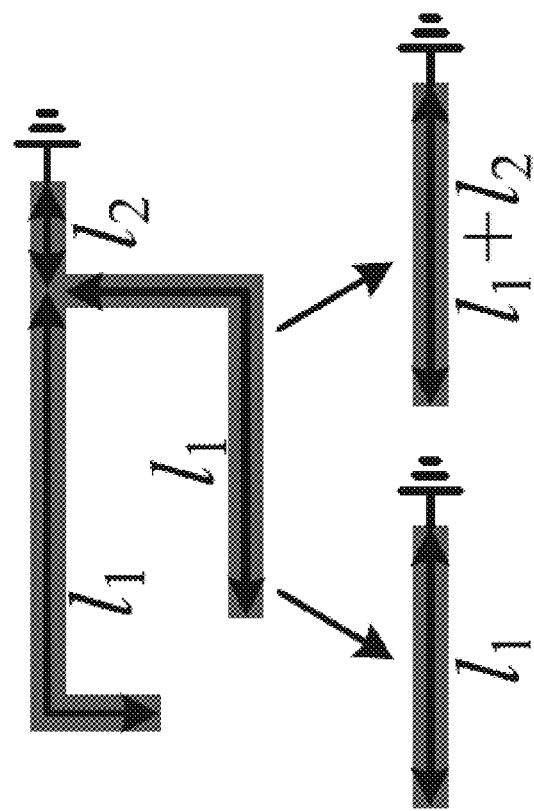
FIG. 6A is a schematic diagram of an odd-mode equivalent circuit of the bandpass impedance transformer in FIG. 4, in which the odd-mode equivalent circuit can be divided into an odd-odd mode sub-circuit and an even-odd mode sub-circuit.

FIGS. 6A and 6B illustrate the odd-mode equivalent circuit and the even-mode equivalent circuit of the quad-mode embodiment of the resonator 402 when the L-shaped stubs are loaded onto the resonator. Each of the odd- and even-mode equivalent circuits can be further dissected using odd-/even-mode bisection to give two sub-circuits (two for each of the odd-/even-mode equivalent circuits). The sub-circuit of $(l_1+l_2+l_3)$ has the lowest fundamental resonant frequency $f_1$. The sub-circuit of $(l_1+l_2)$ has the resonant frequency $f_2$. The sub-circuits $(l_1)$ are identical, with the same frequency $f_3=c/(4l_1\sqrt{\varepsilon_{ef}})$.

Figure 7A:
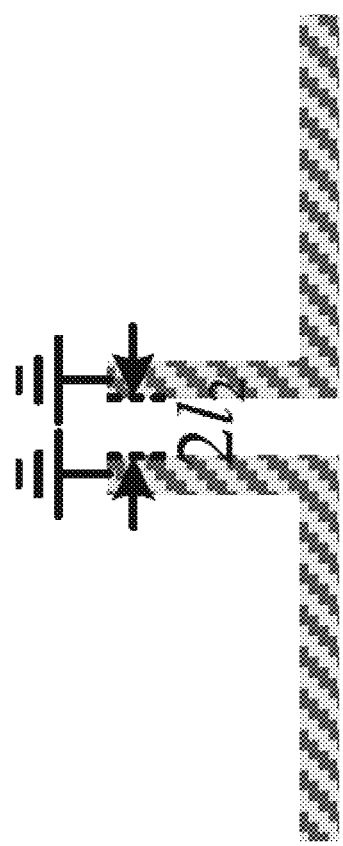
FIG. 7A is a schematic diagram of synchronously tuned $\lambda/4$ coupled resonators formed by the L-shaped stubs in the multimode resonator in the bandpass impedance transformer of FIG. 4 in one embodiment of the invention.
Figure 7B:
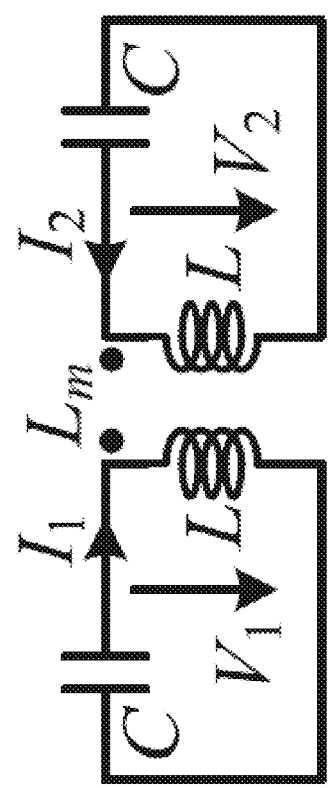
FIG. 7B is a schematic diagram of an equivalent two-port circuit model of the synchronously tuned $\lambda/4$ coupled resonators in FIG. 7A.

FIG. 7A shows the synchronously tuned $\lambda/4$ coupled resonators formed by the L-shaped stubs in the quad-mode embodiment of the resonator 402, while FIG. 7B shows its equivalent two-port model. As shown in FIG. 7A, in an example where $l_2$ is small, the pair of L-shaped stubs approach the short-circuit point, similar to two coupled $\lambda/4$ resonators. In the equivalent two-port network shown in FIGS. 7B, L and C are the self-inductance and self-capacitance presented by microstrip lines of the L-shape stubs. $L_m$ represents the mutual inductance, thus $f_3$ can be spilt into $f_{31}$ and $f_{32}$.

$$f_{31}=1/(2\pi\sqrt{C(L-L_m)}) \quad (6)$$

$$f_{32}=1/(2\pi\sqrt{C(L+L_m)}) \quad (7)$$

Therefore, the resonator embodiment with two L-shape stubs can exhibit a quad-mode characteristic. The multimode design can extend the bandwidth using, minimum, one single resonator. This facilitates circuit size reduction and addresses potential issues with existing cascaded topologies with multiple blocks.

Figure 8:
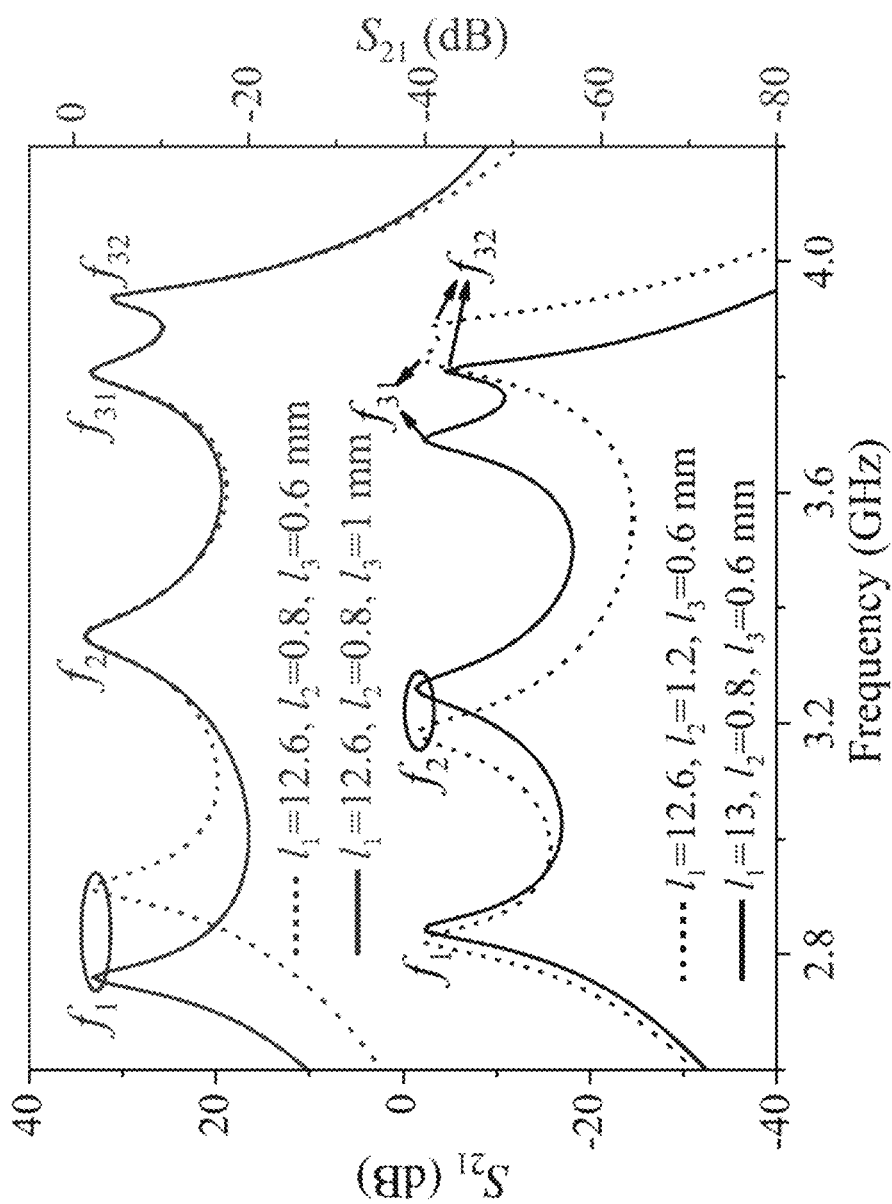
FIG. 8 is a graph showing S21 parameter of a quad-mode impedance transformer constructed based on the bandpass impedance transformer in FIG. 4.

FIG. 8 shows the simulated S21 parameter of the quad-mode embodiment of the resonator 402 under weak couplings. Referring to FIG. 8, the upper solid and dotted lines, it can be seen that increasing $l_3$ only lowers $f_1$, in accordance with the equation, while $f_2$ and $f_3$ remain fixed. All the expressions for resonance depend on $l_1$, and thus its variation affects those resonant modes simultaneously, as shown by the lower solid line.

The relationship between $f_1(f_2)$ and $l_2$ can be inferred. However, $f_3$ should in theory be immune to $l_2$ according to the equation, but in the simulation, $l_2$ does influence $f_3$, especially for the separation between $f_{31}$ and $f_{32}$, as shown with the lower dashed line. This may be because $f_{31}$ and $f_{32}$ are derived from the mutual coupling. A large $l_2$ leads to weak coupling, thus $f_{31}$ and $f_{32}$ approach each other. In order to excite the multimode resonator, the coupled feed scheme is used to realize bandpass responses, which can also achieve the function of impedance transformation.

During operation of the amplifier, such as the ones in the above embodiments, spurious powers may be produced at the drain terminal of the transistor due to the strong non-linearity of the transistor at saturation. Efficiency can be maximized at the fundamental central frequency $f_o$ through setting open-/short-circuit condition at spurious frequencies $((n+1) f_o, n=1,2,3, \ldots )$. Thereafter, the efficiency drops gradually when the operating frequency deviates from $f_o$, as the spurious impedances no longer comply with the ideal open-/short-circuit condition.

Figure 9B:
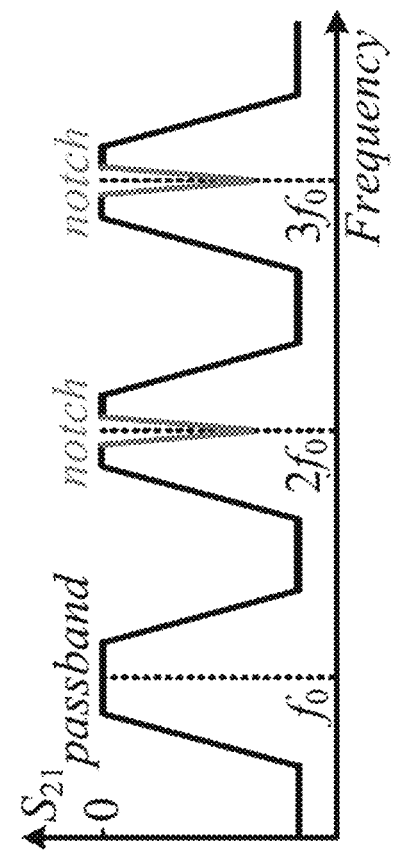
FIG. 9B is a schematic diagram illustrating a spurious suppression scheme for suppressing $3^{rd}$ order spurious frequency response.
Figure 9A:
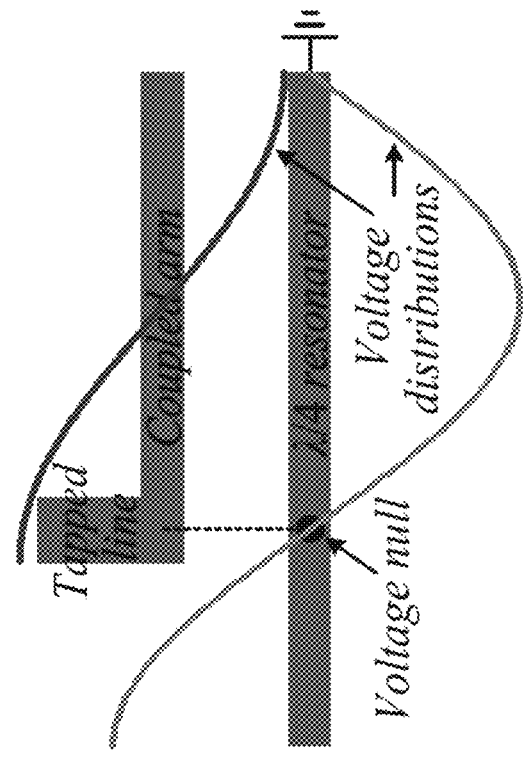
FIG. 9A is a graph showing an undesirable S21 response at the second and third harmonics which the bandpass impedance transformer in FIG. 4 is arranged to avoid.

FIG. 9A shows an undesirable S21 response at the second and third harmonics $2f_o$, $3f_o$, which the bandpass impedance transformer in FIG. 4 aims to prevent or avoid. FIG. 9B illustrates a spurious suppression scheme for suppressing $3^{rd}$ order spurious frequency response.

As shown in FIG. 9A, without proper arrangement, narrow notches (V-shaped) may appear at $(n+1) \cdot f_o$, where power transmission is impeded because of the harmonic-control conditions. While the effect of these notches may be insignificant for the bandpass power amplifier using high-Q resonators (due to its narrow-band characteristic and steep out-of-band rejection), this may be problematic or intolerable for the microstrip bandpass power amplifiers in some embodiments which require harmonic control over a broad spurious-frequency range. As a result, a dual-/quad-mode resonator with the function of spurious suppression may be needed for potential high-efficiency bandpass power amplifier design. According to the analysis above, the dual-/quad-mode resonator is composed of $\lambda_g/4$ resonators in which even-order spurious is inherently non-existent. In some applications, only the $3^{rd}$ spurious needs to be suppressed and there is little if any need to handle higher-than-$3^{rd}$-order spurious considering the complexity of the circuit.

FIG. 9B illustrates the operation mechanism of $3^{rd}$ order spurious suppression in the transformer 400 embodiment. The operation mechanism relies on the coupling feed line as well as the multimode resonator. The unique voltage distribution of the $\lambda_g/4$ resonator at the $3^{rd}$ order spurious frequency is marked as the lower curve and a voltage-null point is evident. The tapped line is arranged to align spatially with this point to avoid exciting the $3^{rd}$ order spurious frequency. In this arrangement, the coupling feed line ("coupled arm") can be regarded as a $\lambda_g/2$ open-ended resonator and its voltage distribution at the fundamental frequency is shown marked as the upper curve. The upper and lower curves represent even and odd functions in the coupling region (from voltage-null point to ground), respectively, thus yielding a zero coupling coefficient. This scheme can effectively reject $3^{rd}$ order spurious signals without much affecting $f_0$.

Dual-Mode Multimode Bandpass Impedance Transformer

Figure 10B:
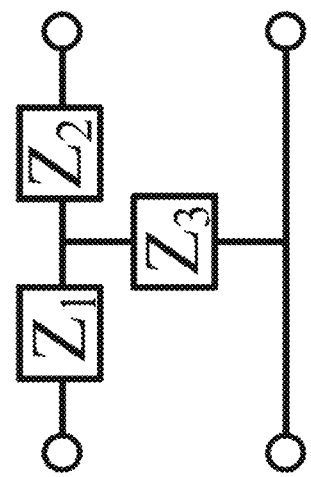
FIG. 10B is a schematic diagram of an equivalent two-port circuit model of the model in FIG. 10A.
Figure 10A:
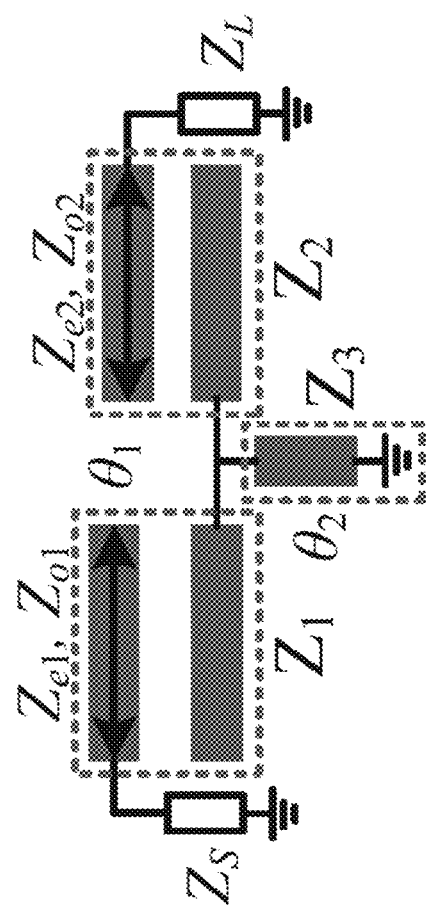
FIG. 10A is a schematic diagram of a simplified model of a dual-mode impedance transformer constructed based on the bandpass impedance transformer in FIG. 4.

FIGS. 10A and 10B provide a simplified model of a dual-mode bandpass impedance transformer and its equivalent two-port network in one embodiment. The simplified model includes three impedance networks $Z_1$ to $Z_3$. For the ease of analysis and presentation, both the electrical lengths of $Z_1$ and $Z_2$ is taken as 1. In this embodiment, the coupling feed lines of multimode bandpass impedance transformers are asymmetrical to achieve or assist an impedance transformation. Although the simplified model is asymmetrical, $\omega_i$ and $g_I$ (see FIG. 4) are chosen to be different from $\omega_0$ and $g_{II}$, to achieve the same power into the Input/Output port. Odd- and even-mode analysis can be applied, with $Z_{ok}$ and $Z_{ek}$ being the odd- and even-mode impedances, respectively. r is the impedance transformation ratio $r=Z_S/Z_L \cdot Z_S$ matches with the load-pull impedance and the imaginary part is ignored. $Z_L$ is a 50Ω output termination. The ABCD matrix of this two-port network can be given as: $A=1+Z_1/Z_3$, $B=Z_1+Z_2+(Z_1Z_2/Z_3)$, $C=1/Z_3$, $D=1+Z_2/Z_3$.

$$A = 1 + \frac{\sqrt{M_1^2 - N_1^2 \cos^2 \theta_1}}{2j \sin \theta_1 \tan \theta_2} \quad (8)$$

$$B = \sum_{k=1}^{2} \frac{\sqrt{M_k^2 - N_k^2 \cos^2 \theta_1}}{2 \sin \theta_1} + \prod_{k=1}^{2} \frac{\sqrt{M_k^2 - N_k^2 \cos^2 \theta_1}}{4 \sin^2 \theta_1 \tan \theta_2} \quad (9)$$

$$C = -j \cot \theta_2,$$

$$D = 1 + \frac{\sqrt{M_2^2 - N_2^2 \cos^2 \theta_1}}{2j \sin \theta_1 \tan \theta_2}$$

$$Z_{ek} - Z_{ok} = M_k, \; Z_{ek} + Z_{ok} = N_k, \; k = 1, 2 \quad (10)$$

S-parameters of the dual-mode multimode bandpass impedance transformer in this embodiment can be derived from above ABCD matrix as:

$$S_{11} = \frac{AZ_L + B - rCZ_L^2 - rDZ_L}{AZ_L + B + rCZ_L^2 + rDZ_L} \quad (11)$$

$$S_{21} = \frac{2\sqrt{r}\, Z_L}{AZ_L + B + rCZ_L^2 + rDZ_L} \quad (12)$$

The effects of the coupling feed lines as well as the effects of the tapped line (width $\omega_t$ and length $l_t$) on the performance of the multimode bandpass impedance transformer in this embodiment are investigated.

FIGS. 11A and 11B show the simulated dual-mode response of the bandpass impedance transformer. In this simulation the following parameters are used: $Z_S=20Ω$, $\omega=0.4$, $\omega_0=1.8$, $l_I=7.7$, $l_{II}=8.7$, $g_I=0.22$, $g_{II}=0.2$, $l_3=1$, $l_1+l_2=12$. In FIG. 11A, $\omega_i$ is changed while $l_i+l_o=4$. In FIG. 11B, $l_i$ and $l_o$ are changed while $\omega_i=2.8$ (all in mm).

As shown in FIGS. 11A and 11B, bandpass responses are centered at 3.5 GHz with 1-dB fractional bandwidth (FBW) of 9.7% (3.29 GHz to 3.63 GHz). The minimum insertion loss is 1.3 dB and with a return loss larger than 13 dB. Two transmission zeros (TZs) are created by the source-load coupling for high selectively. It can be seen that the $2^{nd}$ and $3^{rd}$ spurious frequencies (7 GHz and 10.5 GHz) have been rejected properly. Mismatch at the input port severely may affect the passband response, when $\omega_i$ is selected to 50Ω characteristic impedance, as shown in FIG. 11A. In this design, $Z_S$ is much smaller than 50Ω. Naturally, increasing co, can rectify the mismatch and improve the passband performance. According to the equations and simulated results presented herein, parameters $\omega_i$ and $M_k$ ($N_k$) can be adjusted to improve the multimode bandpass impedance transformer performance. On the other hand, passband responses change minimally when $l_i$ and $l_o$ are varied, as shown in FIG. 10. It is beneficial for the following bandpass power amplifier design because $l_i$ needs be tuned to fulfill the harmonic-control requirement.

Quad-Mode Multimode Bandpass Impedance Transformer

The network in FIG. 10B can also be extended to analyze the quad-mode multimode bandpass impedance transformer by using ABCD matrix, but this may be cumbersome, so instead, coupling matrix synthesis techniques can simplify the analysis. The coupling matrix of the quad-mode bandpass filter can be presented as:

$$M_{BPF} = \begin{bmatrix} 0 & M_{S1} & -M_{S2} & -M_{S3} & M_{S4} & M_{SL} \\ M_{S1} & M_{11} & 0 & 0 & 0 & M_{1L} \\ -M_{S2} & 0 & -M_{22} & 0 & 0 & M_{2L} \\ -M_{S3} & 0 & 0 & M_{33} & 0 & M_{3L} \\ M_{S4} & 0 & 0 & 0 & -M_{44} & M_{4L} \\ M_{SL} & M_{1L} & M_{2L} & M_{3L} & M_{4L} & 0 \end{bmatrix} \quad (13)$$

$$= \begin{bmatrix} 0 & 1.025 & -1.025 & -0.694 & 0.694 & -0.004 \\ 1.025 & 2.087 & 0 & 0 & 0 & 1.025 \\ -1.025 & 0 & -2.087 & 0 & 0 & 1.025 \\ -0.694 & 0 & 0 & 3.974 & 0 & 0.694 \\ 0.694 & 0 & 0 & 0 & -3.974 & 0.694 \\ -0.004 & 1.025 & 1.025 & 0.694 & 0.694 & 0 \end{bmatrix}$$

$M_{si}$($M_{iL}$) means the coupling strength between the feed line and resonant sub-circuit where i=1, 2, 3, 4 represent the four transmission poles (TPs). $M_{s1}$ ($M_{1L}$) and $M_{s2}$($M_{2L}$) correspond to resonant modes $f_1$ and $f_2$, respectively. $M_{s3}$ and $M_{s4}$ root in $f_3$ which is split into $f_{31}$ and $f_{32}$. Therefore, $\sqrt{2}M_{s3}$ ($M_{s4}$)≈$M_{s1}$($M_{s2}$). The diagonal element in the coupling matrix $M_{ii}$ can be given by $M_{ii}=(f_0^2-f_i^2)/\Delta f$. $f_i$ where $f_0$ is the central frequency and fi is the resonant frequency. Based on the impedance renormalized relationship, the coupling matrix of the quad-mode multimode bandpass impedance transformer can be deduced by updating $M_{si}'=M_{si}/\sqrt{Z}$ and $M_{SL}'=M_{SL}/\sqrt{Z}$ where z is the normalized Zs. The i-dB FBW of the quad-mode multimode bandpass impedance transformer is specified as 22%. The coupling matrix of the quad-mode multimode bandpass impedance transformer can be derived as $$M_{BPIT} = \begin{bmatrix} 0 & 1.621 & -1.621 & -1.098 & 1.098 & -0.004 \\ 1.621 & 2.087 & 0 & 0 & 0 & 1.025 \\ -1.621 & 0 & -2.087 & 0 & 0 & 1.025 \\ -1.098 & 0 & 0 & 3.974 & 0 & 0.694 \\ 1.098 & 0 & 0 & 0 & -3.974 & 0.694 \\ -0.006 & 1.025 & 1.025 & 0.694 & 0.694 & 0 \end{bmatrix} \quad (14)$$

The coupling coefficient $k_{i,i+1}$=FBW·$M_{II}$/3=0.15 and the external quality factor Qe=1/($M_{S1}^2$·FBW·2z)=5.4. The desired $k_{i,i+1}$ and $Q_\varepsilon$ can be achieved based on the detailed design procedures provided in L.-H. Zhou and J.-X. Chen, "*Differential dual-band filters with flexible frequency ratio using asymmetrical shunt branches for wideband CM suppression,*" *IEEE Trans. Microw. Theory Techn.*, vol. 65, no. 11, pp. 4606-4615, November 2017.

Figures 12A, 12B:
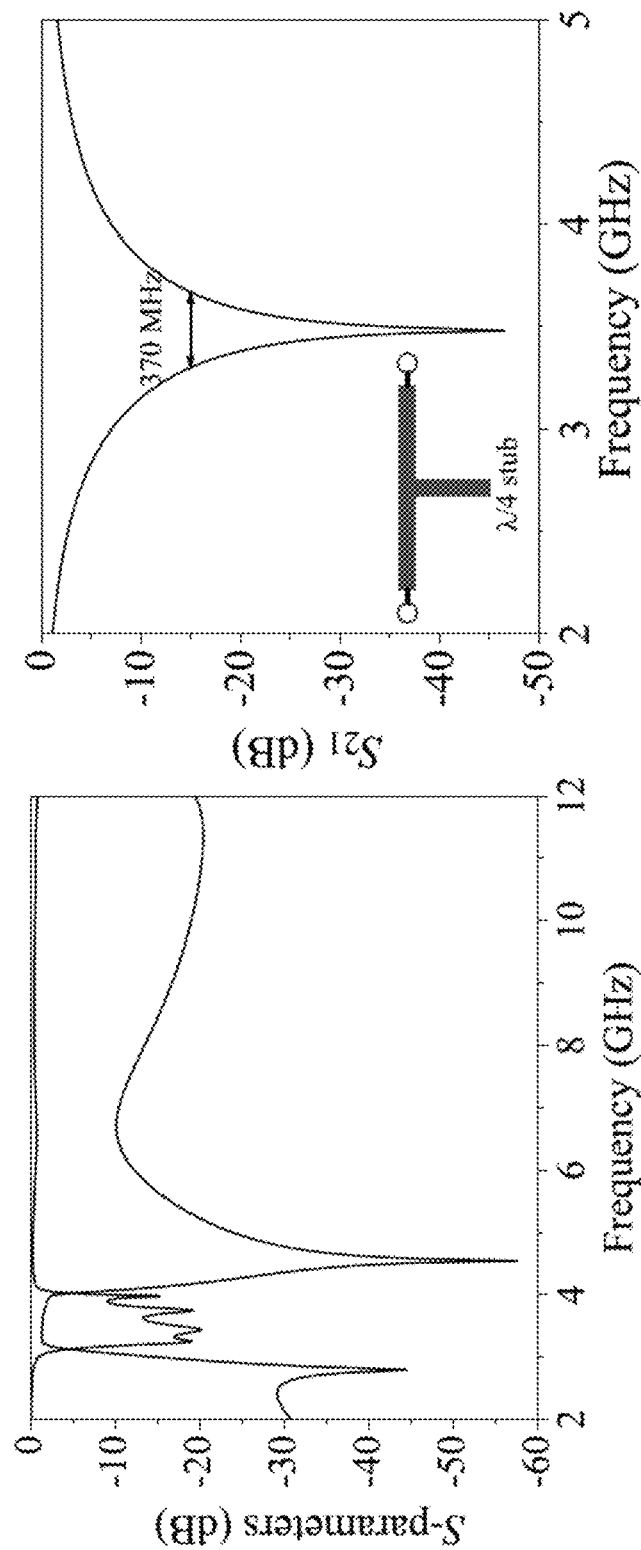
FIG. 12A is a graph showing a simulated quad-mode response (S-parameters) of the bandpass impedance transformer constructed based on the bandpass impedance transformer in FIG. 4.
FIG. 12B is a graph showing S21 parameter of a microstrip line centrally loaded by an open-ended stub which can be treated as a $\lambda_g/4$ transformer.

FIG. 12A is a graph showing a simulated quad-mode response (S-parameters) of the bandpass impedance transformer. The parameters used are: $l_I$=7.3, $l_{II}$=8.5, gI=0.12, $g_{II}$=0.1 (all in mm). FIG. 12B is a graph showing S21 parameter of a microstrip line centrally loaded by an open-ended stub which can be treated as a $\lambda_g/4$ transformer.

As shown in FIG. 12A, similar to the dual-mode multi-mode bandpass impedance transformer design, the tapped and asymmetrical coupling lines are tuned for a good quad-mode response, which also verifies the operation of the spurious suppression mechanism. A flat and wide passband response is centered at 3.6 GHz with a minimum insertion loss of 1.45 dB. Four TPs can be observed except for a slight deterioration at higher frequencies. Compared with the dual-mode design, the bandwidth is extended from 3.2 GHz to 4 GHz, without increasing size and loss of the circuit.

The above dual-/quad-mode multimode bandpass impedance transformer can be applied in the design of high-efficiency power amplifiers, such as but not limited to Class-F or inverse Class-F power amplifiers. Exemplary power amplifiers are designed and fabricated based on the above embodiments, on the substrate Rogers R04003C with a relative dielectric constant of 3.38, a thickness of 0.813 mm and a loss tangent of 0.0027. A Cree CGH40006P Gallium Nitride (GaN) high electron mobility transistor packaged device is selected with gate (drain) voltage of -2.7 (27) V giving a quiescent current of 85 mA. The transistor is evaluated with the source- and load-pull simulations using Keysight advanced design system (ADS) software. The source-pull impedance is selected to be 18-20j.

FIG. 13A shows the power contour and power added efficiency contour of the bandpass impedance transformer at 3.5 GHz using the load-pull simulation. All points in the candidate area can be selected as the load-pull impedance $Z_{lp}$ to simultaneously achieve high output power and efficiency. FIG. 13B shows the power contour and power added efficiency of the bandpass impedance transformer at different frequencies. It can be seen from FIG. 13B that multi-frequency simulation is indispensable because of the wideband design. It is evident that the candidate area shrinks and $Z_{lp}$=18+12j is chosen as a compromise for operation over multiple frequencies.

Figure 14:
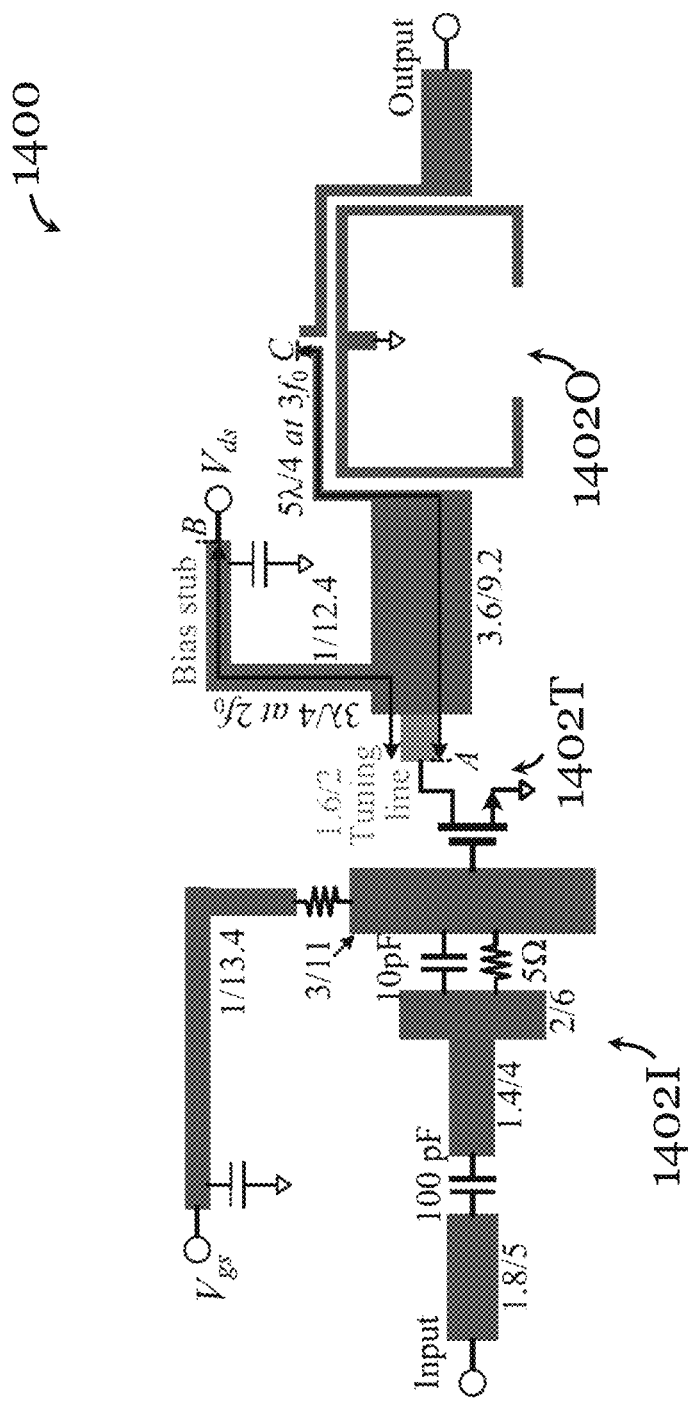
FIG. 14 is a schematic diagram of a dual-mode bandpass inverse Class-F power amplifier in one embodiment of the invention.

FIG. 14 shows a dual-mode bandpass inverse Class-F power amplifier 1400 in one embodiment of the invention. The power amplifier 1400 includes, generally, an input matching circuit 1402I, a transistor 1402T, and an output matching circuit 1402O. In this embodiment the input matching circuit 1402I is a stepped-impedance input matching circuit. The input matching circuit 1402I includes a first generally T-shaped microstrip line and a second generally straight microstrip line. An RC stabilization circuit, formed by parallel 5Ω resistor and 10-pF capacitor, is connected between the first and second microstrip lines. A 100-pF DC blocking capacitor is arranged at the input side of the first microstrip line and the RC stabilization circuit is arranged at the output side of the first microstrip line. A gate bias stub is connected with the second microstrip line via a resistor. The end of the gate bias stub is shorted via bypass capacitor that prevents RF signals from flowing into the DC supply $V_{gs}$. The transistor 1402T may be a high-electron-mobility transistor. The output matching circuit 4020O includes a multimode bandpass impedance transformer that adopts the above described coupled structure (coupling feed lines+dual mode resonator (no L-shaped stubs), as described with respect to FIG. 4), which has innate DC isolation for the output. The structure of the transformer is similar to that of FIG. 4 (as well as other relevant Figures) and so will not be repeated here. The output matching circuit 1402O also has a drain bias stub with an end shorted via bypass capacitor that prevents RF signals from flowing into the DC supply Vas. Unlike the gate bias stub, the drain bias stub connects directly to the multimode bandpass impedance transformer without any resistors to avoid potential deterioration in efficiency. The length $l_{ds}$ of the drain bias stub may be about $\lambda_g/4$ at $f_0$ to minimize the effect on the multimode bandpass impedance transformer. A tuning line is placed before the multimode bandpass impedance transformer, between it and the drain terminal of the transistor 1402T, to compensate for the imaginary part and optimization of performance.

The inverse Class-F power amplifier 1400 provides an open circuit at $2^{nd}$ harmonic frequency and a short circuit at $3^{rd}$ harmonic frequency, respectively. These conditions are fulfilled at least partly with the help of the drain bias stub and coupling feed lines. For the line with length 'AB', the drain impedance $Z_{d,AB}$ at point 'A' can be expressed as $$Z_{d,AB} = Z_0 \frac{Z_{L,B} + jZ_0 \tan \theta_{AB}}{Z_0 + jZ_{L,B} \tan \theta_{AB}},$$

where $\theta_{AB}$ is set to $(2n=1)\lambda_g/4$ at $2f_0$. This can be achieved by selecting the location of the bias stub. $Z_{L,B}$ is zero because of the short-circuit condition at point 'B'. Therefore, $Z_{d,AB}$ is infinite, satisfying the open-circuit condition at $2f_0$. Similarly, the drain impedance $Z_{d,AC}$ for the line with length 'AC' can be obtained. The difference is that $\theta_{AC}$ is $(2n=1)\lambda_g/4$ at $3f_0$, and the length can be adjusted through $l_t$, which has negligible effect on the multimode bandpass impedance transformer response, as shown in FIG. 11B. $Z_{L,C}=\infty$ due to the open-circuit condition at point 'C'. Therefore, $Z_{d,AC}$ is zero for the short-circuit condition at $3f_0$. While various different arrangements can be used to realize the condition of Class-$F^{-1}$ power amplifier, in this case miniaturization is the preferred choice over reduced circuit loss and cost.

In one embodiment, the coupling feed lines should have a proper length to provide sufficient coupling strength. In this embodiment, lengths of $3\lambda_g/4$ at $2f_0$ and $5\lambda_g/4$ at $3f_0$ are selected. Theoretically, Class-$F^{-1}$ conditions are only valid over a narrow band since an ideal $\lambda_g/4$ transformer is only satisfied at center frequency. On one hand, microstrip line suffers from conductive loss due to the low-Q characteristic. On the other hand, the working bandwidth is much wider than the high-Q counterpart. Referring back to FIG. 13B, this FIG. simulates a microstrip line centrally loaded by an open-ended stub which can be treated as a $\lambda_g/4$ transformer.

A deep notch at S21 can be observed at a specific frequency while the bandwidth can still achieve 370 MHz with S21 better than −15 dB. This means the harmonic-control conditions can be satisfied approximately over a wide frequency range, which is very useful for subsequent quad-mode bandpass Class-$F^{-1}$ power amplifier.

Figure 15:
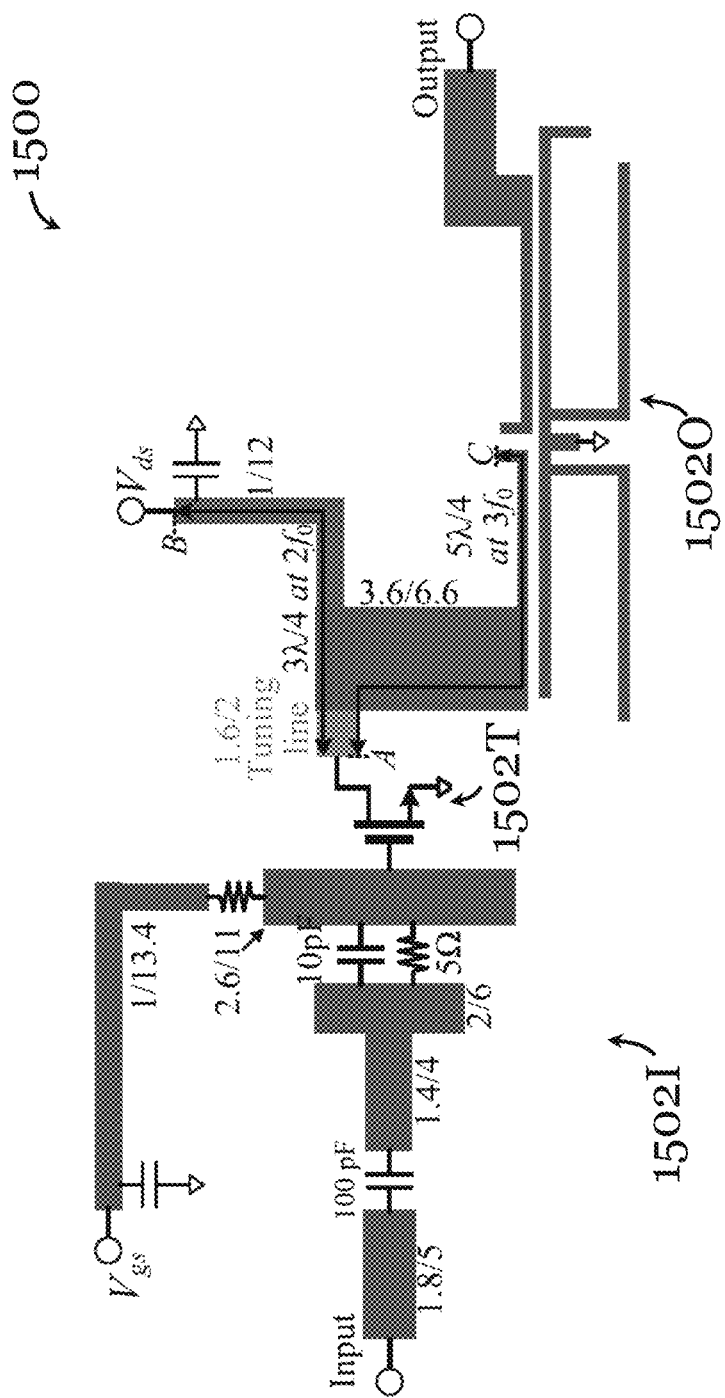
FIG. 15 is a schematic diagram of a quad-mode bandpass inverse Class-F power amplifier in one embodiment of the invention.

FIG. 15 shows a quad-mode bandpass inverse Class-F power amplifier 1500 in one embodiment of the invention. The construction of the amplifier is generally the same as the amplifier 1400 in FIG. 14. The main differences here are that: the resonator includes two L-shaped stubs to enable quad-mode operation as presented above; the specific sizes, forms, or orientations of the drain bias stub, the tapped line, the tuning line are modified.

Figure 16:
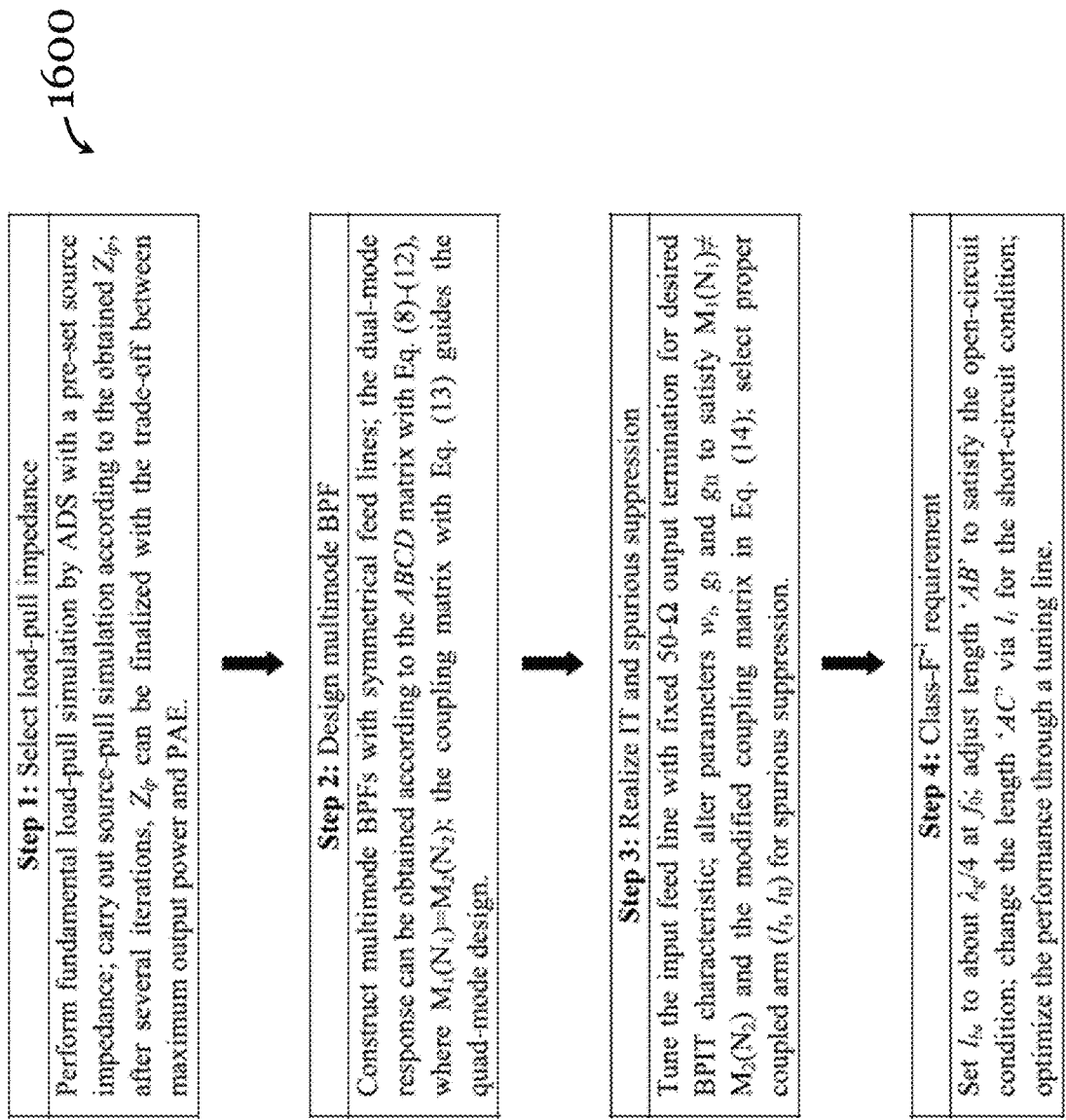
FIG. 16 is a flowchart showing a method for designing a multi-mode bandpass inverse Class-F power amplifier in one embodiment of the invention.

FIG. 16 is a method for designing a bandpass inverse Class-F power amplifier in one embodiment of the invention. In brief, the method 1600 involves making different design choices and adjustments to select the load-pull impedance, design multiple bandpass filter (the bandpass impedance transformer), realize impedance transformation and spurious suppression, and satisfy the inverse Class-F requirement. It should be noted that the power amplifiers in some embodiment of the invention need not be designed using this method 1600.

Figures 17, 18:
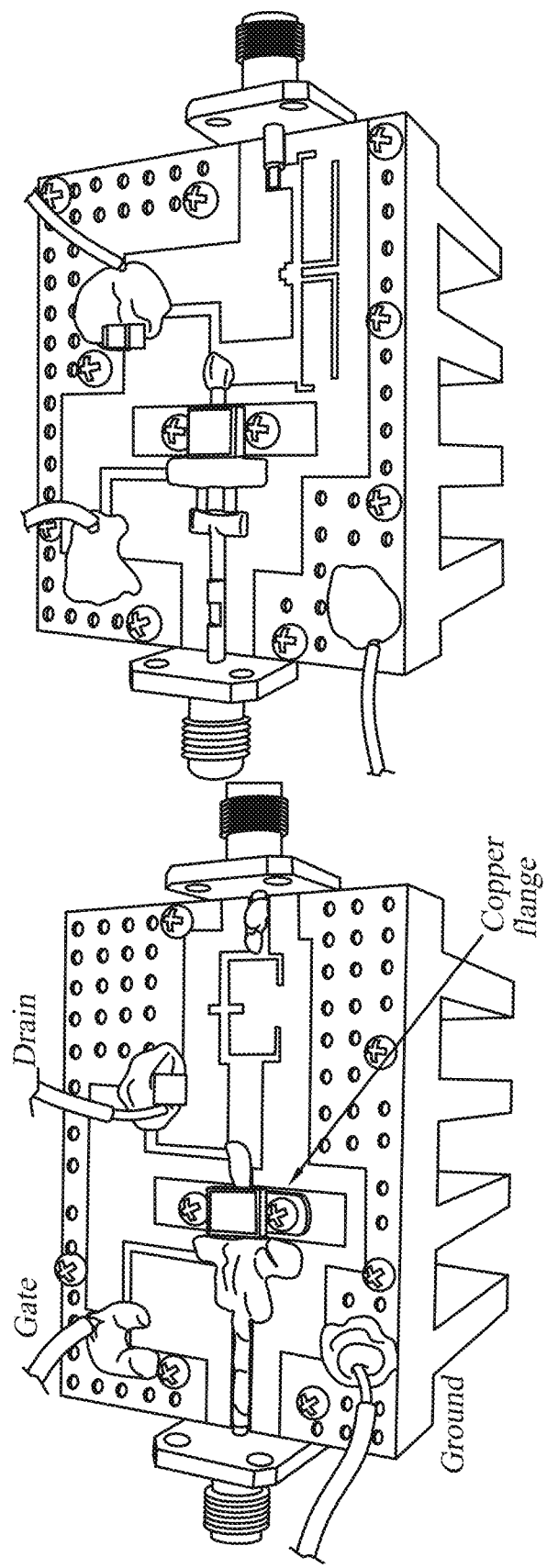
FIG. 17 is a photo of a dual-mode bandpass inverse Class-F power amplifier fabricated based on FIG. 14.
FIG. 18 is a photo of a quad-mode bandpass inverse Class-F power amplifier fabricated based on FIG. 15.

To validate the designs in the above embodiments, a dual-mode bandpass inverse Class-F power amplifier is fabricated based on the amplifier design in FIG. 14 and a quad-mode bandpass inverse Class-F power amplifier is fabricated based on the amplifier design in FIG. 15. The photos of the fabricated amplifiers are shown in FIGS. 17 (dual-mode) and 18 (quad-mode) respectively. In these fabricated designs, the transistor is soldered to a copper flange which is fixed to the heat sink to ensure good grounding and thermal dissipation. The fabricated dual- and quad-mode power amplifiers occupy area (circuit size) of 48.6×29.8 mm² and 46.6×33.3 mm², respectively.

Figures 19A, 19B:
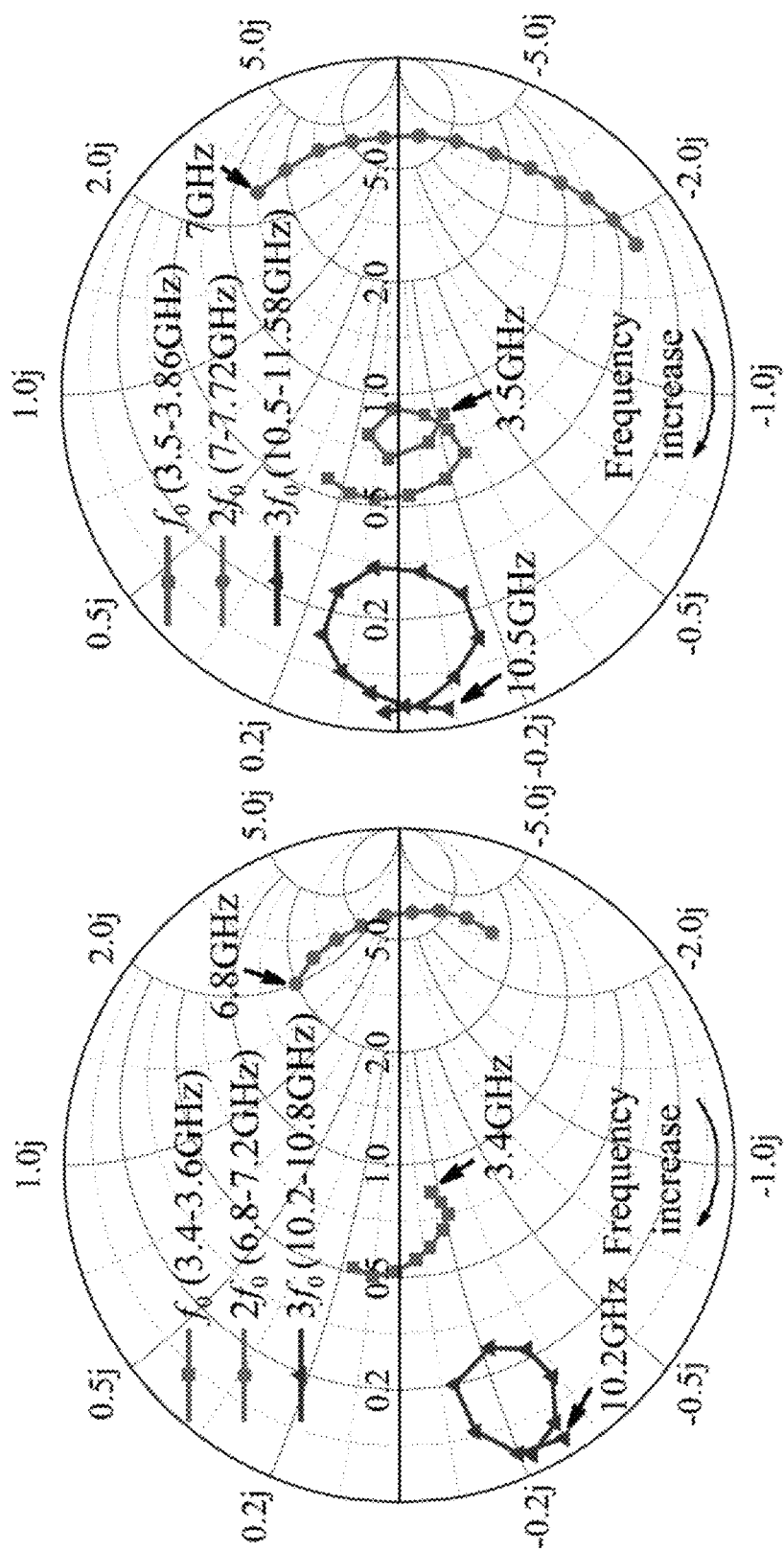
FIG. 19A is a plot showing the fundamental and harmonic impedances of the dual-mode design of FIG. 17 on an I-Gen plane.
FIG. 19B is a plot showing the fundamental and harmonic impedances of the quad-mode design of FIG. 18 on an I-Gen plane.
Figure 20A:
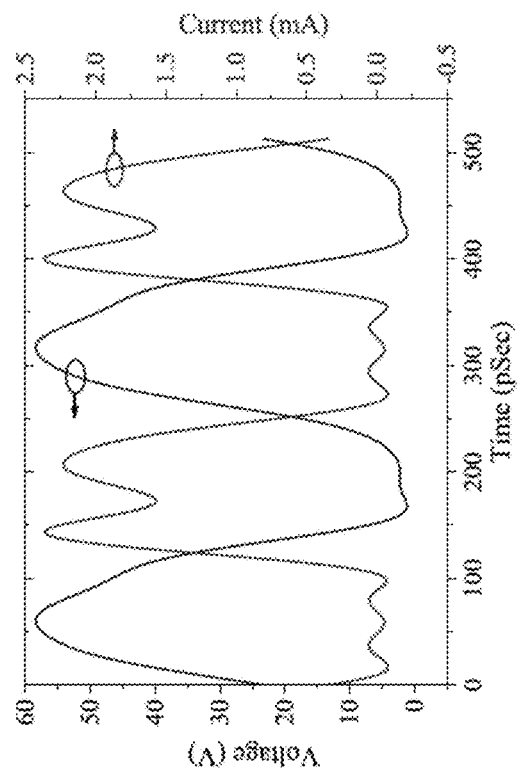
FIG. 20A is a graph showing the voltage and current waveforms at the drain of the dual-mode design of FIG. 17.
Figure 20B:
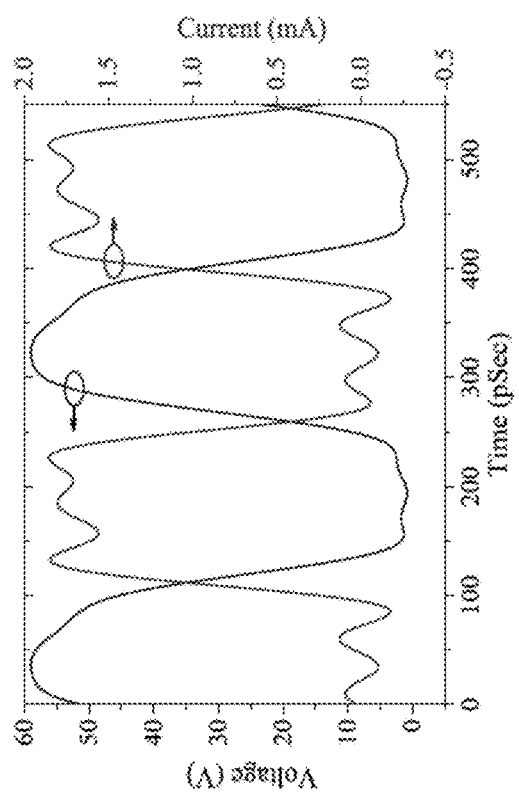
FIG. 20B is a graph showing the voltage and current waveforms at the drain of the quad-mode design of FIG. 18.

FIGS. 19A and 19B show the loci of the fundamental and harmonic impedances of the dual-mode design of FIG. 17 and of the quad-mode design of FIG. 18. The fundamental impedance here is different from $Z_{IP}$ as shown in FIGS. 13A and 13B because the latter is extracted according to the package plane. Impedances at $2f_0$ and $3f_0$ are close to the open- and short-circuit areas, respectively, which is in accordance with the Class-$F^{-1}$ requirement. Simulated voltage and current waveforms shown in FIGS. 20A (dual-mode design of FIG. 17) and 20B (quad-mode design of FIG. 18) also corroborate this result. As shown in FIGS. 20A and 20B, half-sinusoidal and square waves are respectively detected.

Small-signal performance of the dual-mode design of FIG. 17 and the quad-mode design of FIG. 18 was measured using the Agilent ENA series network analyzer $E_{5071}C$.

Figure 21A:
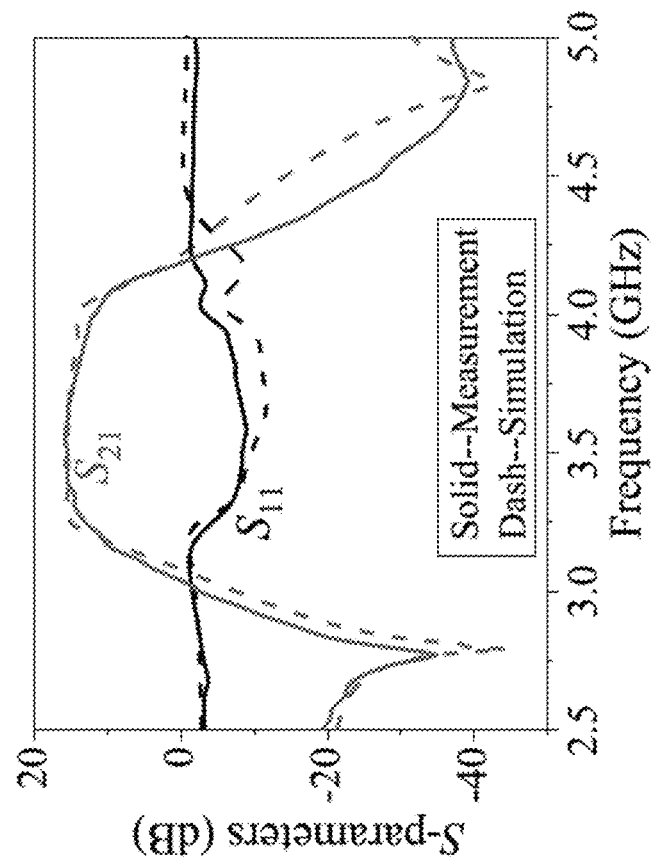
FIG. 21A is a graph showing simulated and measured small-signal S-parameters in the fundamental band of the dual-mode design of FIG. 17.
Figure 21B:
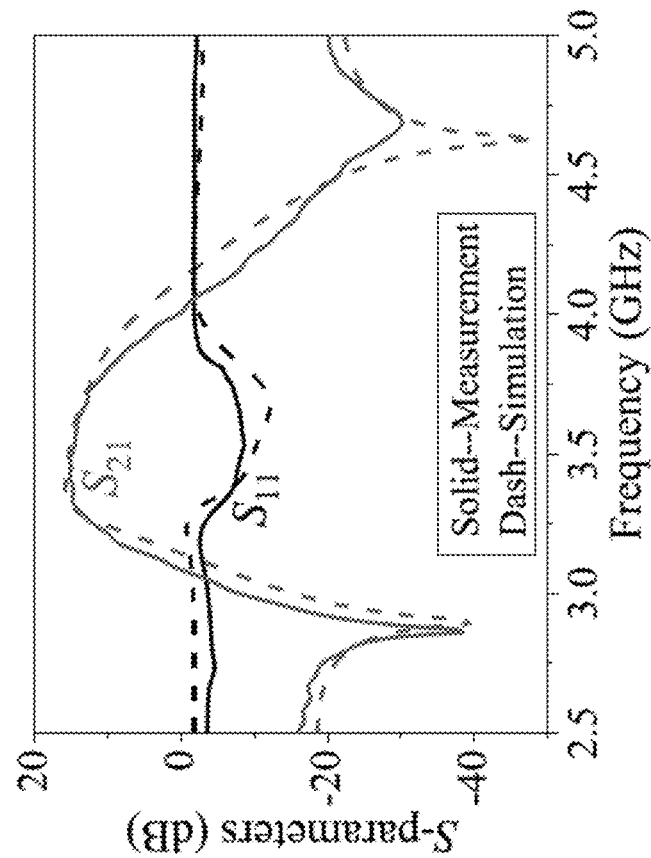
FIG. 21B is a graph showing simulated and measured small-signal S-parameters in the fundamental band of the quad-mode design of FIG. 18.

FIG. 21A shows simulated and measured small-signal S-parameters in the fundamental band of the dual-mode design of FIG. 17; while FIG. 21B shows simulated and measured small-signal S-parameters in the fundamental band of the quad-mode design of FIG. 18. In FIGS. 21A and 21B, good agreement between the simulation and the measurement can be observed, with a slight deviation possibly due to parasitic effects of surface mount devices and fabrication tolerance. The dual-mode passband is cantered at 3.5 GHz and the simulated and measured return losses are better than −11 dB and −8.5 dB from 3.4 GHz to 3.6 GHz, respectively. The maximum measured small-signal gain is about 16.5 dB with two TZs located at 2.86 and 4.68 GHz that can be used to improve selectivity. The bandwidth of the quasi-elliptic quad-mode response is widened with maximum measured small-signal gain of 17.2 dB.

Figure 22A:
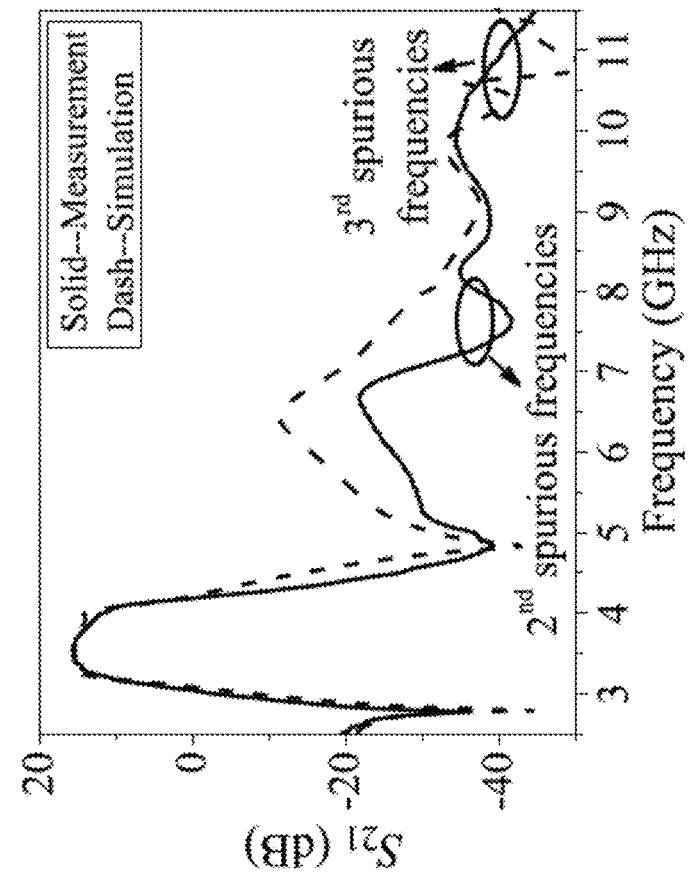
FIG. 22A is a graph showing simulated and measured small-signal S21 parameter in a broad frequency range of the dual-mode design of FIG. 17.
Figure 22B:
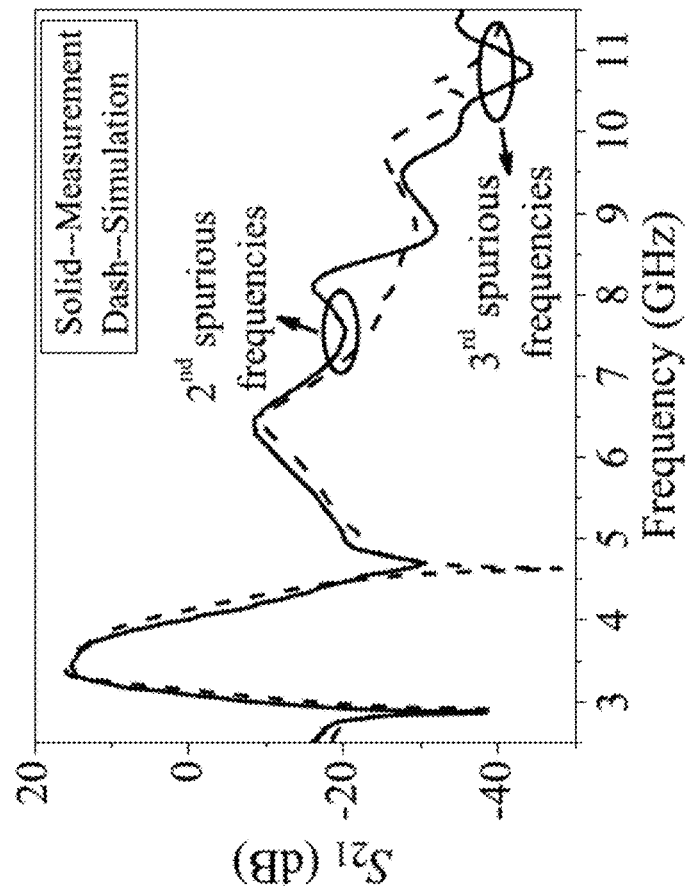
FIG. 22B is a graph showing simulated and measured small-signal S21 parameter in a broad frequency range of the quad-mode design of FIG. 18.

FIG. 22A shows simulated and measured small-signal S21 parameter in a broad frequency range of the dual-mode design of FIG. 17; while FIG. 22B shows simulated and measured small-signal S21 parameter in a broad frequency range of the quad-mode design of FIG. 18. In these Figures, $2^{nd}$ spurious do not exist because the respective multimode bandpass impedance transformers in the dual-mode design and the quad-mode design are made up of λ/4 resonators. The measured $3^{rd}$ spurious frequencies (10-11.5 GHz) are suppressed to below −35 dB, which illustrates the effectiveness of the spurious frequencies suppression scheme described above. The bandpass Class-$F^{-1}$ power amplifiers show deeper suppressions compared to that of the multimode bandpass impedance transformers in FIG. 11A to 12A due to additional high- frequency suppressions provided by the lowpass input matching circuits. The Class-$F^{-1}$ power amplifiers in these examples show good bandpass responses with very broad spurious suppressions.

Figure 23B:
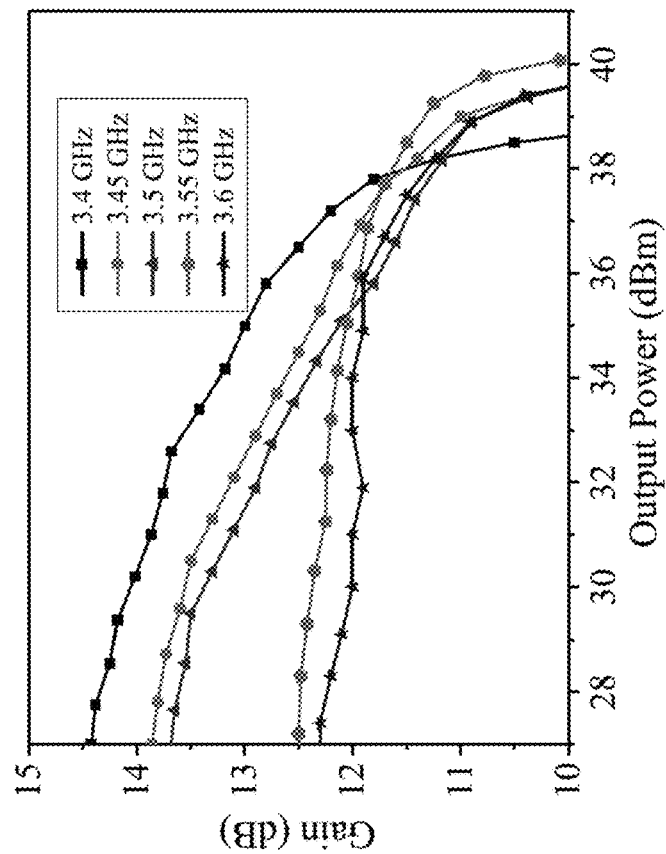
FIG. 23B is a graph showing measured large-signal gain of the dual-mode bandpass inverse Class-F power amplifier of FIG. 17.
Figure 23A:
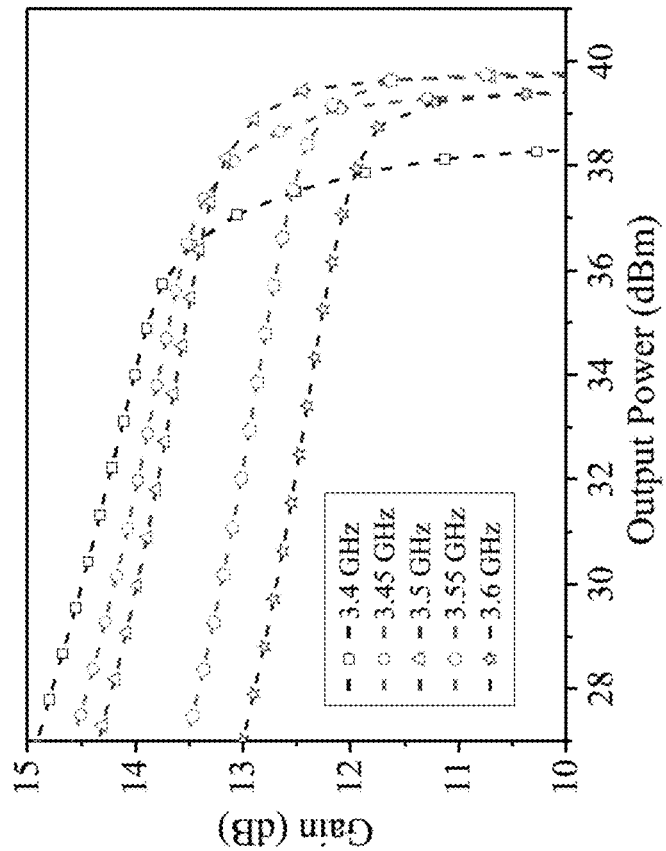
FIG. 23A is a graph showing simulated large-signal gain of the dual-mode bandpass inverse Class-F power amplifier of FIG. 17.

FIGS. 23A and 23B show simulated and measured large-signal gains of the dual-mode bandpass Class-$F^{-1}$ power amplifier embodiment. These Figures compare the simulated and measured large-signal gains of the dual-mode power amplifier, which are larger than 15 dB and 14.3 dB at an output power of 28 dBm. It can be observed that the gains drop as the output power level increases as it approaches the saturation region.

Figure 24B:
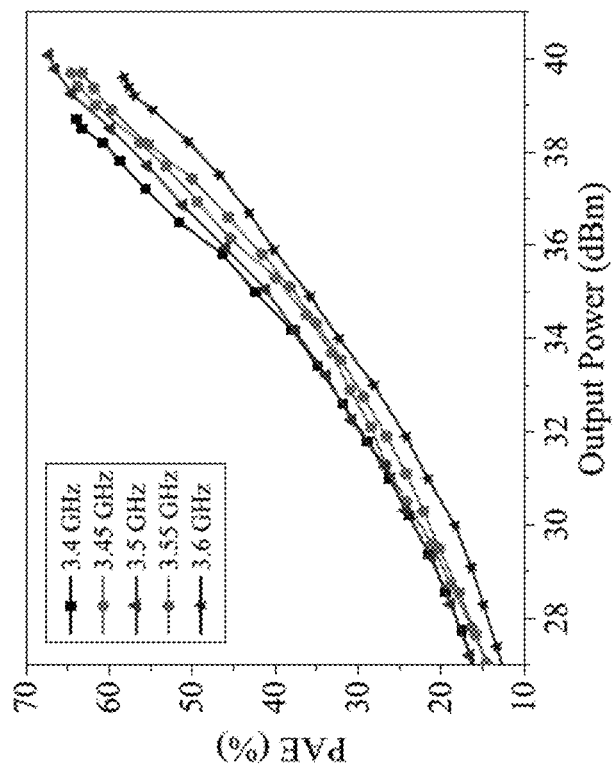
FIG. 24B is a graph showing measured power added efficiency of the dual-mode bandpass inverse Class-F power amplifier of FIG. 17.
Figure 24A:
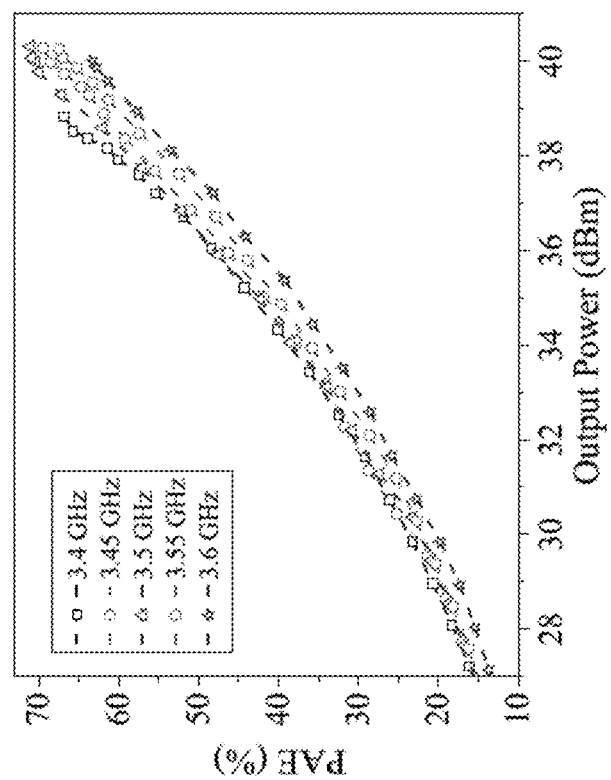
FIG. 24A is a graph showing simulated power added efficiency of the dual-mode bandpass inverse Class-F power amplifier of FIG. 17.

FIGS. 24A and 24B show simulated and measured power added efficiency of the dual-mode bandpass Class-$F^{-1}$ power amplifier embodiment. As shown in these Figures, the maximum simulated and measured P1 gains are 13.4 dB and 11.5 dB, respectively, at an output power of 38.5 dBm from 3.4 to 3.6 GHz. The maximum simulated and measured power added efficiencies are 70.7% and 67.3% at 3.5 GHz with an output power of 40 dBm. From 3.4 to 3.55 GHz, the simulated and measured power added efficiencies are all larger than 63% with output power greater than 39 dBm. The simulated power added efficiency at 3.6 GHz is 63.3% which is a bit higher than the measured value of 58.2%.

Figure 25A:
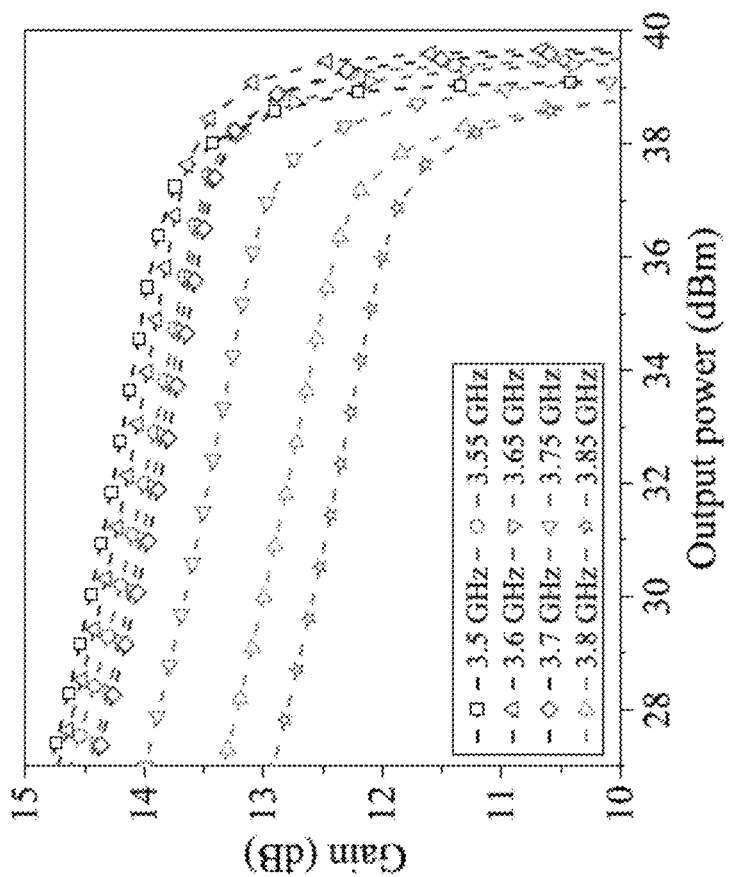
FIG. 25A is a graph showing simulated large-signal gain of the quad-mode bandpass inverse Class-F power amplifier of FIG. 18.
Figure 25B:
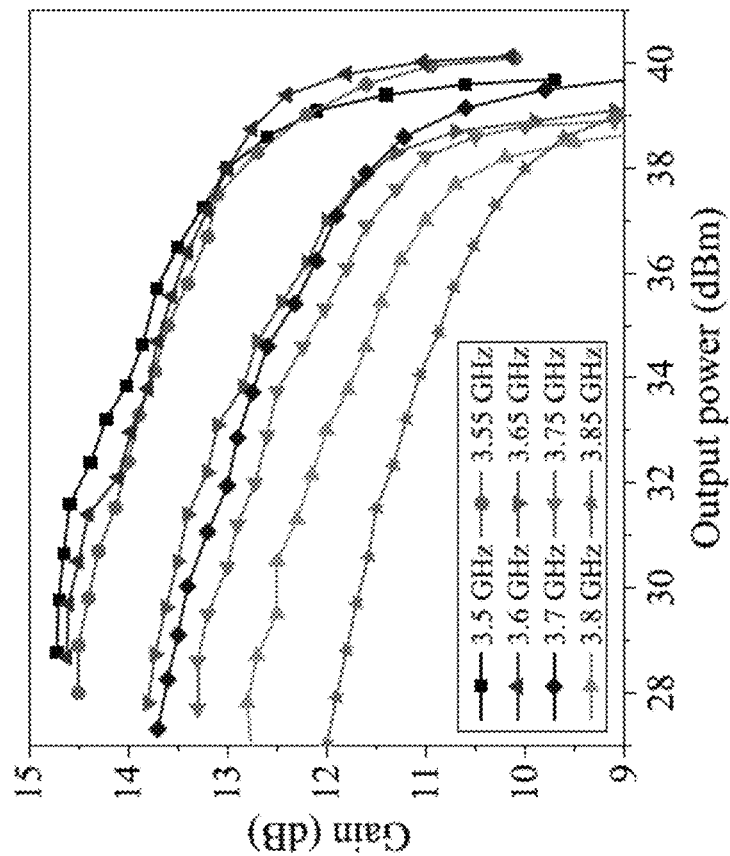
FIG. 25B is a graph showing measured large-signal gain of the quad-mode bandpass inverse Class-F power amplifier of FIG. 18.

FIGS. 25A and 25B show simulated and measured large-signal gains of the quad-mode bandpass Class-$F^{-1}$ power amplifier embodiment. These Figures show that the simulated and measured large-signal gains of the quad-mode design are greater than 14.7 dB and 14.6 dB at an output power of 28 dBm, over the frequency range 3.5 GHz to 3.85 GHz. The maximum simulated and measured P1 gains are 13.6 dB and 12.6 dB, respectively, at the output power of 38.5 dBm.

Figure 26B:
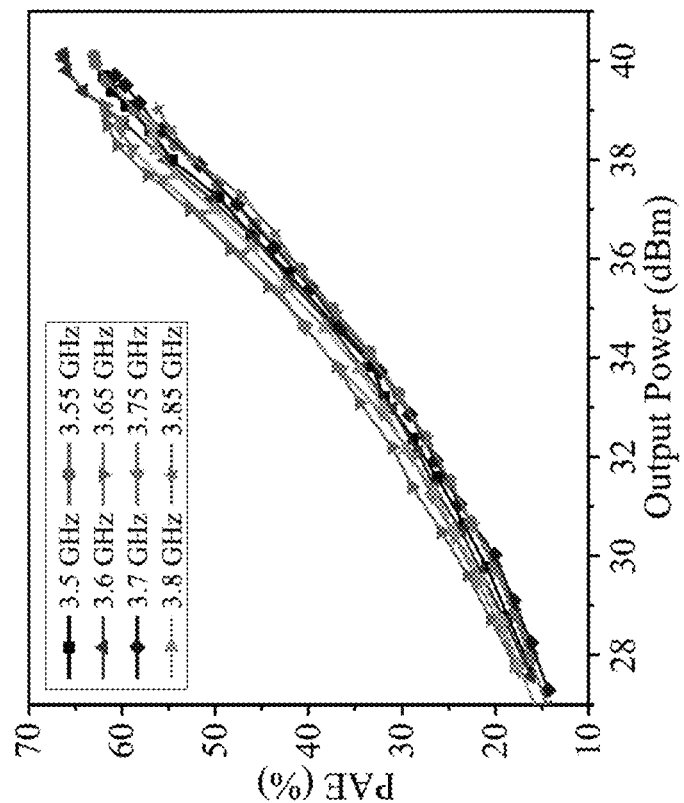
FIG. 26B is a graph showing measured power added efficiency of the quad-mode bandpass inverse Class-F power amplifier of FIG. 18.
Figure 26A:
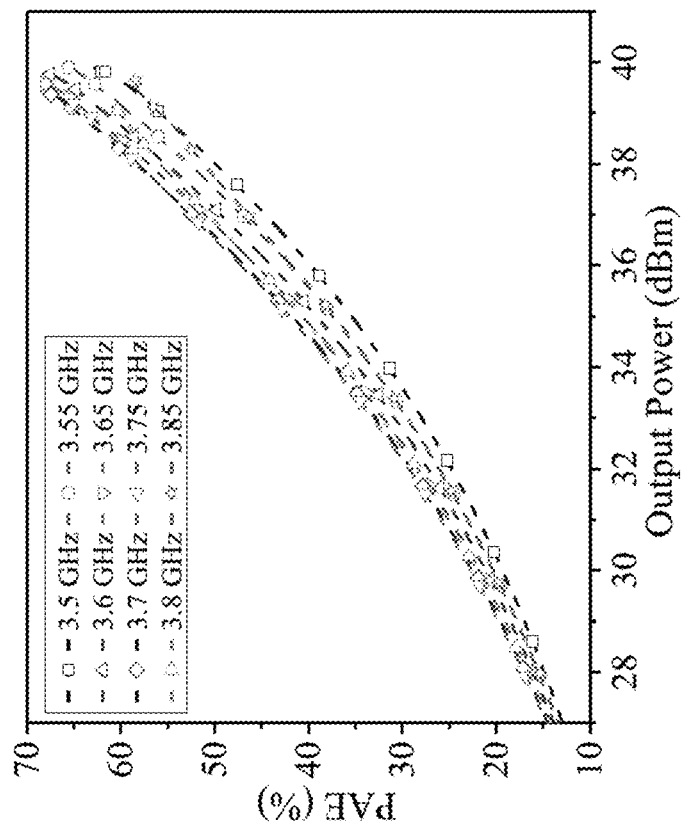
FIG. 26A is a graph showing simulated power added efficiency of the quad-mode bandpass inverse Class-F power amplifier of FIG. 18.

FIGS. 26A and 26B show simulated and measured power added efficiency of the quad-mode bandpass Class-$F^{-1}$ power amplifier embodiment. As shown in these Figurse, the maximum simulated and measured power added efficiencies are 68.2% and 66.3%, respectively, as shown in FIG. 23. The simulated power added efficiencies are all larger than 61% from 3.5 GHz to 3.8 GHz and reduce to 58.4% at 3.85 GHz as it approaches its maximum frequency of operation. The measured power added efficiencies are larger than 60% from 3.5 GHz to 3.75 GHz and greater than 56% over the whole measured frequency range.

Figure 27B:
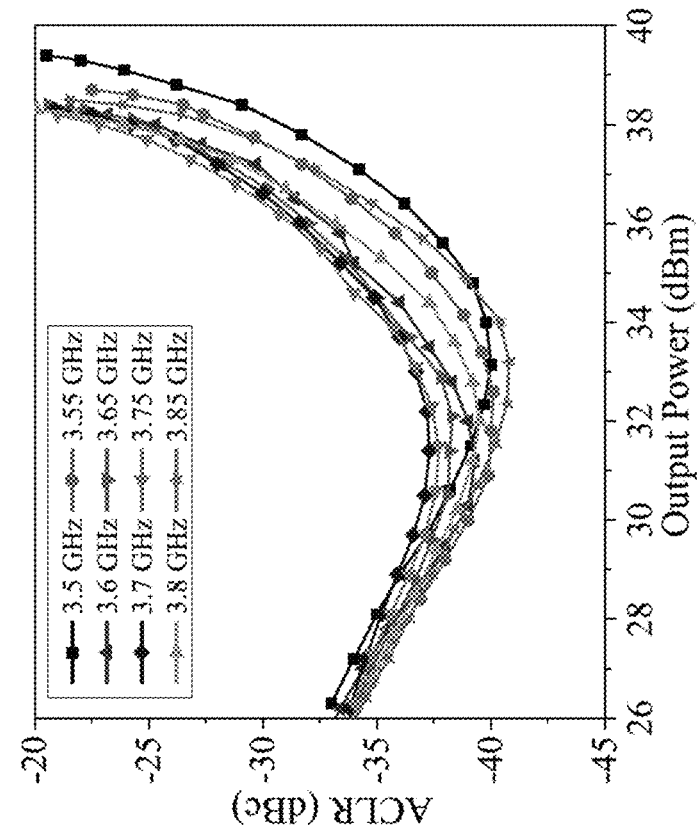
FIG. 27B is a graph showing measured adjacent channel leakage ratio (ACLR) of the dual-mode bandpass inverse Class-F power amplifier of FIG. 18.
Figure 27A:
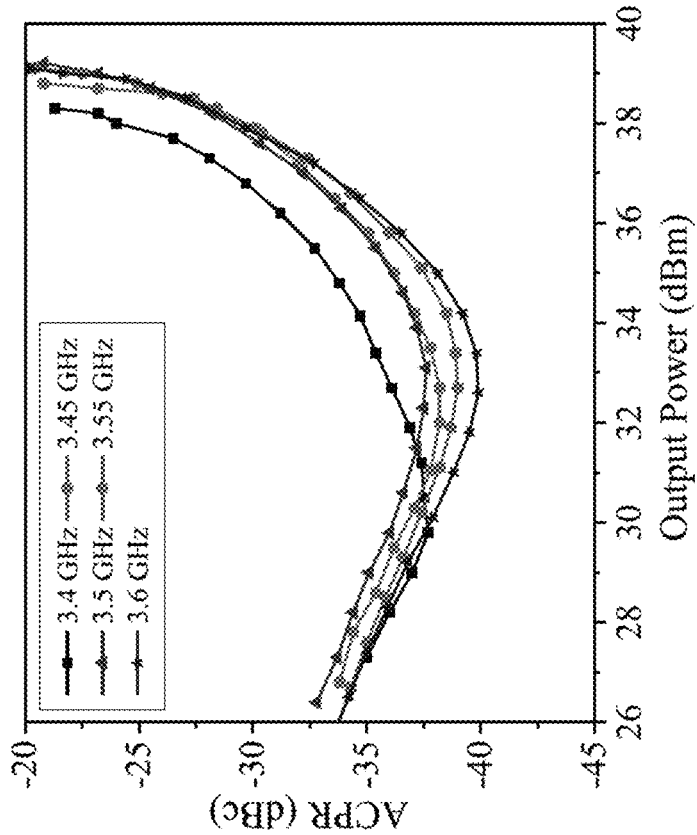
FIG. 27A is a graph showing measured adjacent channel power ratio (ACPR) of the dual-mode bandpass inverse Class-F power amplifier of FIGS. 17.

To verify the linearity of the bandpass power amplifiers in these embodiments, measurements were performed using a Keysight signal generator E4433B and an R&S® FSV signal analyzer. A single carrier WCDMA 3GPP test signal with peak to average power ratio of 6.5 dB at 0.1% probability of complementary cumulative distribution function is generated. Adjacent channel power ratio (ACPR) was measured with a 3.84 MHz channel bandwidth at a 5-MHz offset. The measured results are shown in FIGS. 27A and 27b (only one of them shown due to similar ACPRs for both lower and upper bands). The adjacent channel leakage ratio (ACLR) performance of the dual- and quad-mode power amplifiers embodiments are both better than −20 dBc at saturation.

The above embodiments of the invention have provided a power amplifier with an impedance transformer, in particular a multimode bandpass impedance transformer, as the output matching circuit. The power amplifier can provide multiple transmission poles, which can provide a flat and wide bandwidth.

Some specific implementations provide a wideband Class-$F^{-1}$ power amplifier based on the microstrip dual mode or quad-mode multimode bandpass impedance transformer. The harmonic-control power amplifiers can achieves good bandpass response. The designs may be constructed using a single dual-mode/quad-mode resonator, which can extend bandwidth without increasing circuit size. The multimode resonator can provide multiple TPs, which enable a wide and flat passband, which is very important for bandpass power amplifier because its performance, such as power added efficiency, is susceptible to degradation due to ripples. The power amplifiers in some of the embodiments can simultaneously achieve high efficiency, good frequency selectivity, size reduction and wide bandwidth. The amplifier design of the invention enables high-performance, cost-effective power amplifiers for MIMO and 5G and other emerging communication standards.

One important function of the above embodiments is to achieve a high-efficiency bandpass power amplifier over a wide frequency range. Some amplifiers embodiments can be designed at different wireless communication frequency bands, especially adapted for $_5$G communications, such as in base station and mobile handsets applications. The bandpass power amplifier in some embodiments can provide 56% power added efficiency at saturation while covering a 350 MHz bandwidth (3.5 GHz-3.85 GHz). The bandpass power amplifier in some embodiments can present a wideband filtering characteristic and suppress spurious in a broad frequency band. The spurious suppression technique can utilize the different voltage-wave distributions of feed lines and resonator to deeply reject the spurious are in a broad frequency range.

It will be appreciated by persons skilled in the art that numerous variations and/or modifications may be made to the invention as shown in the specific embodiments without departing from the scope of the invention as broadly described and defined in the claims.

For example, the shape, size, and form of the amplifier of the invention can be different from those illustrated. The microstrip lines of the amplifier can be of different lengths, have different number of turns or branches. The specific dimensions of the microstrip lines and the properties of the circuit components (resistance of resistor, capacitance of capacitor, and/or inductance of inductor) can be different from those illustrated. The materials for making the power amplifier are not limited to those described above. Different types of transistors may be used depending on the specific applications of the power amplifier. The power amplifier need not be an inverse Class-F amplifier, but may be used as other high efficiency power amplifiers. In one example, the power amplifier may be specifically suitable for operation of 5G cellular communication, but in some other examples, the power amplifier may alternatively or additionally be suited or otherwise adapted for operation with other wireless/cellular communication protocols.

The input and output matching circuits can be implemented differently from those illustrated. The geometry, shape, size, form, etc., of the bandpass impedance transformer, in particular the multimode bandpass impedance transformer and its multimode resonator and coupling feed lines can be modified to be different than those illustrated, preferably with the coupled structure preserved. In some examples, the multimode resonator can be excited by coupling feed lines, but in some other examples, tapped feed lines may alternatively or additionally be used. The multimode resonator with multiple resonant frequencies may be of any topologies, including but not limited to folded line(s) and/or loaded stub. Depending on implementation, the spurious suppression mechanism can be applied to suppress any one or more high-order spurious frequencies, including but not limited to $3^{rd}$ order spurious frequencies. The bandwidth extension technique can be used for different power applications. The power amplifier can be used in radio frequency systems, microwave systems, etc.

The described embodiments of the invention should therefore be considered in all respects as illustrative, not restrictive.

The invention claimed is:

1. A power amplifier comprising:
an active device; and
an output matching circuit operably connected with the active device,
wherein the output matching circuit comprises a multimode bandpass impedance transformer for output matching.

2. The power amplifier of claim 1, wherein the multimode bandpass impedance transformer is a dual-mode bandpass impedance transformer.

3. The power amplifier of claim 1, wherein the multimode bandpass impedance transformer is a quad-mode bandpass impedance transformer.

4. The power amplifier of claim 1, wherein the multimode bandpass impedance transformer comprises a multimode resonator and coupling feed lines operably connected with the multimode resonator.

5. The power amplifier of claim 4, wherein the coupling feed lines are operably connected with the multimode resonator in a non-contact manner.

6. The power amplifier of claim 4, wherein the coupling feed lines are microstrip lines.

7. The power amplifier of claim 6, wherein the coupling feed lines comprises separate first and second coupling feed lines that are operably coupled with each other.

8. The power amplifier of claim 7, wherein the multimode bandpass impedance transformer further comprises a tapped line connected between the active device and the first coupling feed line.

9. The power amplifier of claim 4, wherein the multimode resonator is a microstrip resonator.

10. The power amplifier of claim 9, wherein the microstrip resonator has an axis of symmetry.

11. The power amplifier of claim 10, wherein the multimode bandpass impedance transformer is asymmetric relative to the axis of symmetry.

12. The power amplifier of claim 9, wherein the microstrip resonator comprises an $\lambda_g/2$ open-ended resonator loaded by short-circuit stub.

13. The power amplifier of claim 12, wherein the short-circuit stub is connected to a central part of the $\lambda_g/2$ open-ended resonator.

14. The power amplifier of claim 12, wherein the microstrip resonator further comprises two L-shaped stubs connected with the $\lambda_g/2$ open-ended resonator.

15. The power amplifier of claim 14, wherein the short-circuit stub is spatially arranged between the two L-shaped stubs.

16. The power amplifier of claim 14, wherein the two L-shaped stubs are of the same form and size.

17. The power amplifier of claim 9, wherein the microstrip resonator comprises an $\lambda_g/2$ open-ended resonator loaded by short-circuit stub; wherein the $\lambda_g/2$ open-ended resonator defines a $\lambda_g/4$ resonator; and wherein the tapped line is aligned with a voltage null point of the $\lambda_g/4$ resonator for spurious response suppression.

18. The power amplifier of claim 1, wherein the active device comprises a field effect transistor.

19. The power amplifier of claim 1, wherein the active device comprises a high-electron-mobility transistor.

20. The power amplifier of claim 1, wherein the power amplifier is an inverse Class-F power amplifier.

21. An inverse Class-F bandpass power amplifier comprising:
- a transistor; and
- an output matching circuit operably connected with the transistor,
- wherein the output matching circuit comprises a multi-mode bandpass impedance transformer for output matching.

22. A communication device comprising the power amplifier of claim 1.

* * * * *